(12) United States Patent
Osawa et al.

(10) Patent No.: US 7,939,845 B2
(45) Date of Patent: May 10, 2011

(54) NITRIDE SEMICONDUCTOR LIGHT-EMITTING DEVICE AND PRODUCTION METHOD THEREOF

(75) Inventors: Hiroshi Osawa, Chiba (JP); Takashi Hodota, Ichihara (JP)

(73) Assignee: Showa Denko K.K., Tokyo (JP)

( * ) Notice: Subject to any disclaimer, the term of this patent is extended or adjusted under 35 U.S.C. 154(b) by 394 days.

(21) Appl. No.: 12/067,227

(22) PCT Filed: Sep. 20, 2006

(86) PCT No.: PCT/JP2006/318641
§ 371 (c)(1),
(2), (4) Date: Mar. 18, 2008

(87) PCT Pub. No.: WO2007/034834
PCT Pub. Date: Mar. 29, 2007

(65) Prior Publication Data
US 2009/0283793 A1  Nov. 19, 2009

(30) Foreign Application Priority Data

Sep. 20, 2005  (JP) .................................. 2005-272424
Sep. 20, 2005  (JP) .................................. 2005-272574

(51) Int. Cl.
*H01L 33/00* (2010.01)
(52) U.S. Cl. .................................. 257/99; 257/E33.062
(58) Field of Classification Search .................... 257/99, 257/33.062, E33.064, E33.065
See application file for complete search history.

(56) References Cited

U.S. PATENT DOCUMENTS

| 2001/0055324 A1 | 12/2001 | Ota |
| 2009/0184329 A1* | 7/2009 | Miki et al. ...................... 257/79 |

FOREIGN PATENT DOCUMENTS

| JP | 09-097922 A | 4/1997 |
| JP | 2001-274507 A | 10/2001 |
| JP | 2003-309286 A | 10/2003 |
| JP | 2004-047704 A | 2/2004 |
| JP | 3511970 B2 | 3/2004 |

* cited by examiner

*Primary Examiner* — Mark Prenty
(74) *Attorney, Agent, or Firm* — Sughrue Mion, PLLC

(57) ABSTRACT

Disclosed is a semiconductor device which is improved in output power efficiency since reflection by the substrate is reduced. This semiconductor device is also excellent in strength characteristics of a supporting substrate. Also disclosed is a method for producing such a semiconductor device. Specifically disclosed is a nitride semiconductor device wherein at least an n-type semiconductor layer, a light-emitting layer, a p-type semiconductor layer, a metal film layer and a plated metal plate are sequentially stacked in this order on a substrate. This nitride semiconductor device is characterized in that the metal film layer and the plated metal plate are partially formed on the p-type semiconductor layer. Also disclosed is a nitride semiconductor device having a structure wherein at least an n-type semiconductor layer, a light-emitting layer, a p-type semiconductor layer, a metal film layer and a plated metal plate are sequentially stacked in this order, the device characterized in that the metal film layer and the plated metal plate are partially formed on the p-type semiconductor layer and a light-transmitting material layer is formed on the p-type semiconductor layer in a region where the metal film layer and the plated metal plate are not formed.

34 Claims, 9 Drawing Sheets

NITRIDE SEMICONDUCTOR LIGHT-EMITTING DEVICE AND PRODUCTION METHOD THEREOF

TECHNICAL FIELD

The present invention is related to a nitride semiconductor light-emitting device and a production method thereof.

Priority is claimed on Japanese Patent Application No. 2005-272424, filed Sep. 20, 2005, and Japanese Patent Application No. 2005-272574, filed Sep. 20, 2005.

BACKGROUND ART

In recent years, gallium nitride (GaN)-based compound semiconductor light-emitting devices has attracted attention as short wavelength light-emitting devices. This gallium nitride based-compound semiconductor is formed using a method such as the metal-organic chemical vapor deposition method (MOCVD method) or the molecular beam epitaxial method (MBE method) on substrates of various oxides or group III to group V compounds starting with a sapphire single crystal.

A sapphire single crystal substrate has a lattice constant which differs from the lattice constant of GaN by 10% or more. However, since a nitride semiconductor having excellent properties can be formed by forming on a sapphire single crystal substrate, a buffer layer comprising AlN or AlGaN, a sapphire single crystal substrate is widely used. For example, when a sapphire single crystal substrate is used, an n-type semiconductor layer, a light-emitting layer, and a p-type semiconductor layer are formed on the sapphire single crystal substrate in this order. Since a sapphire single crystal substrate is an insulant, in general, in a device comprising a sapphire single crystal substrate, both a positive electrode formed on the p-type semiconductor layer and a negative electrode formed on an n-type semiconductor layer are positioned on one side of the device. Examples of a method for extracting light from a device comprising positive and negative electrodes on one side includes a face-up method in which light is extracted from the p-type semiconductor side using a transparent electrode such as ITO as a positive electrode, and a flip-chip method in which light is extracted from the sapphire substrate side using a highly reflective film such as Ag as a positive electrode.

As is explained above, sapphire single crystal substrates are widely used. However, since sapphire is an insulant, a sapphire single crystal substrate has some problems.

First of all, in order to form the negative electrode, the n-type semiconductor is exposed by etching the light-emitting layer; therefore, the area of light-emitting layer is reduced by the area of the negative electrode, and output power decreases.

Secondly, since the positive electrode and the negative electrode are positioned on the same side, electrical current flows horizontally, current density is increased locally, and the device generates heat.

Thirdly, since heat conductivity of a sapphire substrate is low, generated heat is not diffused, and the temperature of the device increases.

In order to solve these problems, a method is used in which a conductive substrate is attached to a device comprising an n-type semiconductor layer, a light-emitting layer, and a p-type semiconductor layer which are stacked on a sapphire single crystal substrate in this order, the sapphire single crystal substrate is removed, and then a positive electrode and a negative electrode are positioned on both sides of the resulting stacked layers (For example, see Patent document 1).

In addition, the conductive substrate is formed by plating, not by attaching (For example, see Patent document 2).

Examples of a method for attaching a conductive substrate include a method in which metal compounds having a low melting point such as AuSn are used as an adhesive, or an activation junction method in which a surface to be joined is activated by argon plasma under vacuum. These methods require that the surface to be attached be extremely flat and smooth. Therefore, if there is foreign matter such as particles on the surface to be attached, the area is not closely attached. Due to this, it is difficult to obtain a uniformly attached surface.

When a substrate is made by plating, it is advantageous that there is little influence from extraneous material; however, light-extracting efficiency decreases because the side of a p-type semiconductor is covered by plating.

In order to improve the light-extracting efficiency, the general method is to form a Ag layer having high reflectivity on the ohmic contact layer before plating processing. However, light absorption in the light-emitting layer becomes a problem because most reflected light must transmit through the light-emitting layer.

In order to prevent reflected light be generated as much as possible, a semiconductor device using a transparent substrate as a supporting substrate is proposed (For example, Patent see document 3).

However, when a transparent substrate is used for a supporting substrate, for example, when using SOG (a spin-on glass), there is a problem in that a substrate having sufficient strength cannot be formed because about 5 µm is the thickness limit of a thick film.

Patent document 1, Japanese Patent (Granted) Publication No 3511970.

Patent document 2, Japanese Unexamined Patent Application, First Publication No. 2004-47704.

Patent document 3, Japanese Unexamined Patent Application, First Publication No. 2003-309286.

DISCLOSURE OF THE INVENTION

In light of the problems mentioned above, the present invention has an object to provide a semiconductor device which is not only excellent in strength characteristics of a supporting substrate, but also has an improved light-extracting efficiency by reducing reflection from the supporting substrate, and a production method thereof.

As a result of conducting diligent research that focused on solving these problems, the present inventors found that it is possible to produce a device which is not only excellent in strength characteristics of a supporting substrate, but also has an improved light-extracting efficiency by reducing reflection from the supporting substrate by stacking at least an n-type semiconductor layer, a lighting emitting layer, a p-type semiconductor layer, a metal film and a plated metal plate sequentially wherein the metal film layer and the plated metal plate are partially formed on the p-type semiconductor layer. Specifically, the advantage of the invention is highlighted when the metal film and the plated metal plate are formed in a grid.

That is, the present invention relates to the following:
(1) A nitride semiconductor light-emitting device, comprising:
an n-type semiconductor layer,
a light-emitting layer,
a p-type semiconductor layer,
a metal film layer, and
a plated metal plate,
which are stacked on a substrate,
wherein the metal film layer and the plated metal plate are formed partially on the p-type semiconductor layer.
(2) A nitride semiconductor light-emitting device according to (1), comprising:
an n-type semiconductor layer,
a light-emitting layer,
a p-type semiconductor layer,
a metal film layer, and
a plated metal plate,
which are stacked on a substrate,
wherein the metal film layer and the plated metal plate are formed in a cross shape from the top view on the p-type semiconductor layer.
(3) A nitride semiconductor light-emitting device according to (1) or (2), wherein the ratio of an area of the metal film layer and the plated metal plate formed on the p-type semiconductor layer to an area of a top surface of p-type semiconductor is in a range of 10 to 90%.
(4) A nitride semiconductor light-emitting device according to any one of (1) to (3), wherein the n-type semiconductor layer, light-emitting layer and the p-type semiconductor layer are pre-divided to an individual device unit on the substrate beforehand.
(5) A nitride semiconductor light-emitting device according to any one of (1) to (4), further comprising a transparent electrode on the p-type semiconductor layer.
(6) A nitride semiconductor light-emitting device according to any one of (1) to (5), further comprising an ohmic contact layer.
(7) A nitride semiconductor light-emitting device according to any one of (1) to (6), wherein the ohmic contact layer is composed of a simple substance metal and/or an alloy of Pt, Ru, Os, Rh, Ir, Pd, Ag.
(8) A nitride semiconductor light-emitting device according to any one of (1) to (7), wherein the ohmic contact layer has a thickness in a range of 0.1 nm to 30 nm.
(9) A nitride semiconductor light-emitting device according to any one of (1) to (8), wherein the plated has a thickness in a range of 10 μm to 200 μm.
(10) A nitride semiconductor light-emitting device according to any one of (1) to (9), wherein the plated metal plate is composed of a NiP alloy, Cu or an alloy of Cu.
(11) A nitride semiconductor light-emitting device according to any one of (1) to (10), further comprising a plating adhesion layer formed between the metal film layer and the plated metal plate.
(12) A nitride semiconductor light-emitting device according to (11), wherein the plating adhesion layer comprises a component at 50% by weight or more, which is the same as the main plating component which is contained at 50% by weight or more in the plated metal layer.
(13) A nitride semiconductor light-emitting device according to (11) or (12), wherein the plating adhesion layer is composed of a NiP alloy or a Cu alloy.
(14) A method of producing a nitride semiconductor light-emitting device, comprising:
forming stacked layers by stacking at least an n-type semiconductor layer, a light-emitting layer, a p-type semiconductor layer, a metal film layer, a plated metal plate on a substrate,
wherein the metal film layer and the plated metal plate are formed partially on the p-type semiconductor layer.
(15) The method of producing a nitride semiconductor light-emitting device according to (14), wherein the metal film layer and the plated metal plate are formed in a cross shape from the top view on the p-type semiconductor layer.
(16) The method of producing a nitride semiconductor light-emitting device according to (14) or (15),
wherein the n-type semiconductor layer is formed on a substrate through the intermediary of a buffer layer, and when the process of forming stacked layers is performed, the n-type semiconductor layer is exposed by removing the substrate and the buffer layer.
(17) The method of producing a nitride semiconductor light-emitting device according to (16), wherein the substrate is removed by using a laser.
(18) The method of producing a nitride semiconductor light-emitting device according to any one of (14) to (17), further comprising a heat-treating process in a temperature range from 100° C. to 300° C. after forming the plated metal plate.

As a result of conducting diligent research that focused on solving these problems, the present inventors found that it is possible to produce a device which is not only excellent in strength characteristics of a supporting substrate, but also has an improved light-extracting efficiency by reducing reflection from the supporting substrate by stacking at least an n-type semiconductor layer, a lighting emitting layer, a p-type semiconductor layer, a metal film and a plated metal plate sequentially wherein the metal film layer and the plated metal plate are partially formed on the p-type semiconductor layer and a light-permeable material layer is formed on the p-type semiconductor layer in a region where the metal film layer and the plated metal plate are not formed. Specifically, the advantage of the invention is highlighted when the metal film layer and the plated metal plate are formed in a cross shape from the top view on the p-type semiconductor layer, and a light-permeable material layer is formed on the p-type semiconductor layer in a region where the metal film layer and the plated metal plate are not formed.

That is, the second aspect in accordance with the present invention relates to the following:
(1) A nitride semiconductor light-emitting device, comprising:
an n-type semiconductor layer,
a light-emitting layer,
a p-type semiconductor layer,
a metal film layer, and
a plated metal plate,
which are stacked on a substrate,
wherein the metal film layer and the plated metal plate are formed partially on the p-type semiconductor layer, and
a light-permeable material layer is formed on the p-type semiconductor layer in a region where the metal film layer and the plated metal plate are not formed.
(2) A nitride semiconductor light-emitting device according to (1), wherein the metal film layer and the plated metal plate are formed in a cross shape from the top view on the p-type semiconductor layer, and a light-permeable material layer is formed on the p-type semiconductor layer in a region where the metal film layer and the plated metal plate are not formed.

(3) A nitride semiconductor light-emitting device according to (1) or (2), wherein a light-permeable material layer is formed on the p-type semiconductor layer, and the light-permeable material layer is surrounded at least partially by the metal film layer and the plated metal plate.

(4) A nitride semiconductor light-emitting device according to any one of (1) to (3), wherein a light-permeable material layer is formed on the p-type semiconductor layer through the intermediary of a transparent electrode, and the light-permeable material layer is surrounded at least partially by the metal film layer and the plated metal plate.

(5) A nitride semiconductor light-emitting device according to any one of (1) to (4), wherein the light-permeable material layer is made from a light-permeable resin, a silica-based material or a titania-based material.

(6) A nitride semiconductor light-emitting device according to any one of (1) to (5), wherein a refractive index of the light-permeable material layer is in a range of 1.4 to 2.6.

(7) A nitride semiconductor light-emitting device according to one of (1) to (6), wherein a thickness of the light-permeable material layer is in a range of 10 µm to 200 µm.

(8) A nitride semiconductor light-emitting device according to any one of (1) to (7), wherein the n-type semiconductor layer, light-emitting layer and the p-type semiconductor layer are pre-divided to an individual device unit on the substrate beforehand.

(9) A nitride semiconductor light-emitting device according to any one of (1) to (8), further comprising an ohmic contact layer.

(10) A nitride semiconductor light-emitting device according to any one of (1) to (9), wherein the ohmic contact layer is composed of a simple substance metal and/or an alloy of Pt, Ru, Os, Rh, Ir, Pd Ag.

(11) A nitride semiconductor light-emitting device according to any one of (1) to (10), wherein the ohmic contact layer has a thickness in a range of 0.1 nm to 30 nm.

(12) An nitride semiconductor light-emitting device as claimed in claim any one of (1) to (11), the plated has a thickness in a range of 10 µm to 200 µm.

(13) A nitride semiconductor light-emitting device according to claim 14, wherein the plated metal plate is composed of a NiP alloy, Cu or an alloy of Cu.

(14) A nitride semiconductor light-emitting device according to any one of (1) to (13), further comprising a plating adhesion layer formed between the metal film layer and the plated metal plate.

(15) A nitride semiconductor light-emitting device according to (14), wherein the plating adhesion layer comprises a component at 50% by weight or more, which is the same as the main plating component which is contained at 50% by weight or more in the plated metal plate.

(16) A nitride semiconductor light-emitting device according to (14) or (15), wherein the plating adhesion layer is composed of a NiP alloy or a Cu alloy.

(17) A method of producing a nitride semiconductor light-emitting device, comprising:
    forming stacked layers by stacking at least an n-type semiconductor layer, a light-emitting layer, a p-type semiconductor layer, a metal film layer, a plated metal plate on a substrate, wherein the metal film layer and the plated metal plate are formed partially on the p-type semiconductor layer, and
    a light-permeable material layer is formed on the p-type semiconductor layer in a region where the metal film layer and the plated metal plate are not formed.

(18) The method of producing a nitride semiconductor light-emitting device according to (17), wherein the metal film layer and the plated metal plate are formed in a cross shape from the top view on the p-type semiconductor layer.

(19) The method of producing a nitride semiconductor light-emitting device according to (17) or (18), wherein the n-type semiconductor layer is formed on a substrate through the intermediary of a buffer layer, and when the process of forming stacked layers is performed, the n-type semiconductor layer is exposed by removing the substrate and the buffer layer.

(20) The method of producing a nitride semiconductor light-emitting device according to any one of (17) to (19), wherein the substrate is removed by using a laser.

(21) The method of producing a nitride semiconductor light-emitting device according to any one of (17) to (20), further comprising a heat-treating process in a temperature range from 100° C. to 300° C. after forming the plated metal plate.

According to the nitride semiconductor light-emitting device of the present invention, at least an n-type semiconductor layer, a lighting emitting layer, a p-type semiconductor layer, a metal film and a plated metal plate are stacked sequentially wherein the metal film layer and the plated metal plate are partially formed on the p-type semiconductor layer.

As a result, a device which is not only excellent in strength characteristics of a supporting substrate, but also has an improved light-extracting efficiency by reducing reflection from the supporting substrate can be obtained. Specifically, the advantage of the invention is highlighted when the metal film and the plated metal plate are formed in the grid.

According to the nitride semiconductor light-emitting device of the present invention, at least an n-type semiconductor layer, a light-emitting layer, a p-type semiconductor layer, a metal film and a plated metal plate are stacked sequentially wherein the metal film layer and the plated metal plate are partially formed on the p-type semiconductor layer and a light-permeable material layer is formed on the p-type semiconductor layer in a region where the metal film layer and the plated metal plate are not formed.

As a result, an output power of the nitride semiconductor light-emitting device is improved because it is harder for total internal reflection to occur after increasing a critical angle by using a material with a high refractive index of 1.4 to 2.6 as a light-permeable material. In addition, the reason the upper limit is 2.6 is because it is not necessary to use a material with a refractive index more than that of GaN, which has a refractive index of 2.6. When it is more than the limit, it becomes difficult to extract light from a light-permeable material.

According to the present invention, a device which is not only excellent in strength characteristics of a supporting substrate, but also has an improved light-extracting efficiency by reducing reflection from the supporting substrate, and has high output power can be obtained.

Specifically, the advantage of the invention is highlighted when the metal film layer and the plated metal plate are formed in a cross shape from the top view on the p-type semiconductor layer, and a light-permeable material layer is formed on the p-type semiconductor layer in a region where the metal film layer and the plated metal plate are not formed.

DENOTATION OF REFERENCE NUMERALS IN FIGURES

1 . . . nitride semiconductor light-emitting device,
201 . . . sapphire substrate (substrate),
102, 202 . . . buffer layer,
103, 203 . . . n-type semiconductor layer,
104, 204 . . . light-emitting layer,
105, 205 . . . p-type semiconductor layer,
106, 206 . . . transparent electrode,
107, 207 . . . ohmic contact layer,
108, 208 . . . reflection layer,
109, 209 . . . plating adhesion layer
110, 210 . . . plated metal plate,
111 . . . positive electrode,
114, 214 . . . light-permeable material.

BEST MODE FOR CARRYING OUT THE INVENTION

An embodiment of a nitride semiconductor compound light-emitting device of the present invention is explained referring to figures.

However, the present invention is not limited to each of following embodiments, and may be a combination of the following examples.

First Embodiment

Figure 1:
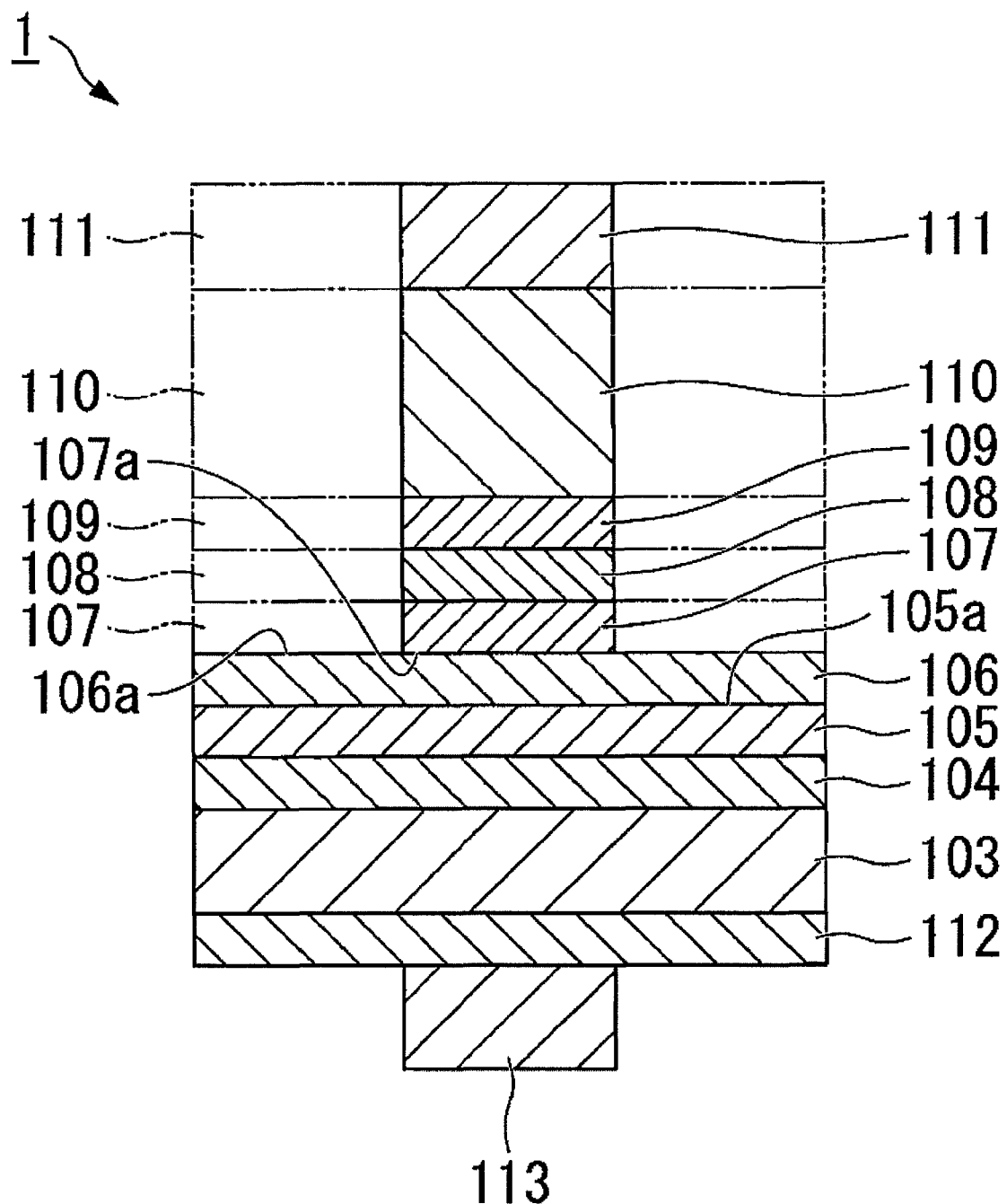
FIG. 1 is a view showing a cross-sectional structure of the nitride-based compound semiconductor light-emitting device of the present invention as an example.
Figure 2:
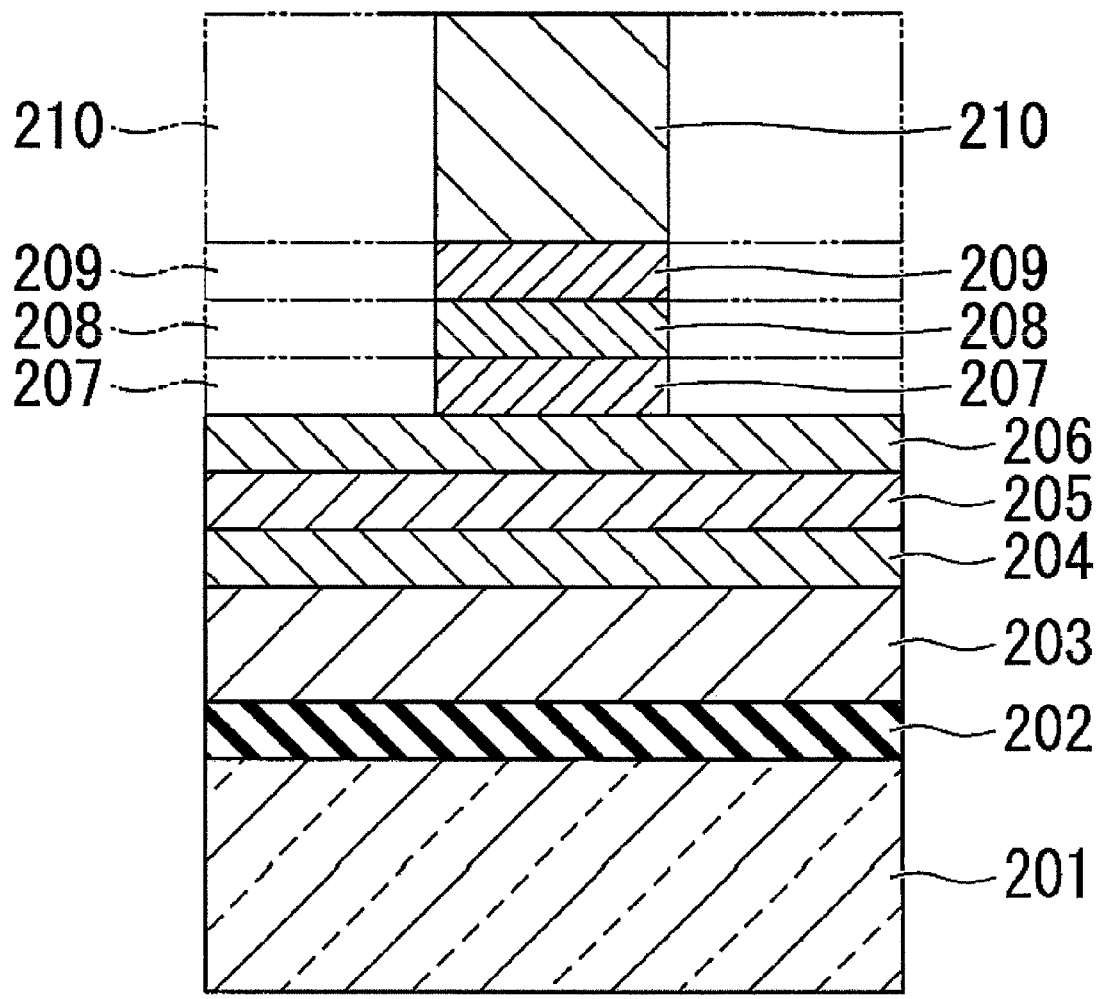
FIG. 2 is a view of a cross-sectional structure for explaining a production method for a nitride semiconductor light-emitting device of the present invention.

FIG. 1 to FIG. 4 show a nitride semiconductor light-emitting device of the present embodiment, and FIG. 1 is a cross-sectional view showing an example of a nitride semiconductor light-emitting device of the present invention, in which an n-type semiconductor layer, a light-emitting layer and a p-type semiconductor layer are formed, and on these layers, an ohmic layer, a reflection layer and a plating adhesion layer are formed, and on these layers, a plated metal plate is formed. FIG. 2 shows the method to produce a nitride semiconductor light-emitting device as an example. In the embodiment, the nitride semiconductor layer shown in FIG. 2 was formed before the formation of the structure of top and bottom placement of electrodes shown in FIG. 1. In addition, the two-dotted lines shown in FIG. 1 and FIG. 2 express the part of the cross shape from the top view formed by an ohmic layer, a reflection layer, a plating adhesion layer, a plated metal plate and a positive electrode (Positive electrode 111 in FIG. 1).

Figure 3:
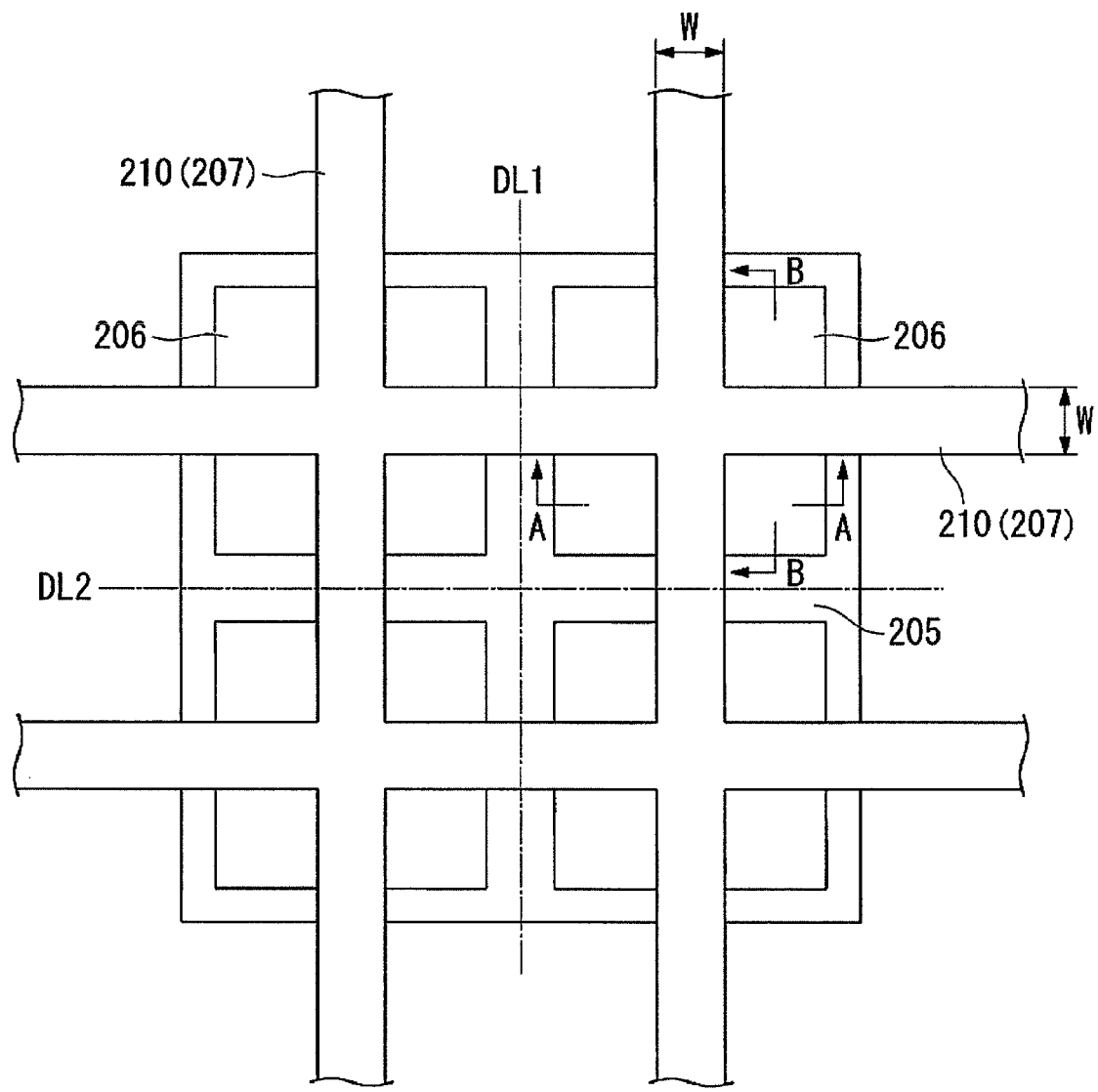
FIG. 3 is a top view showing a state before the division of a nitride semiconductor light-emitting device of the present invention.
Figure 4:
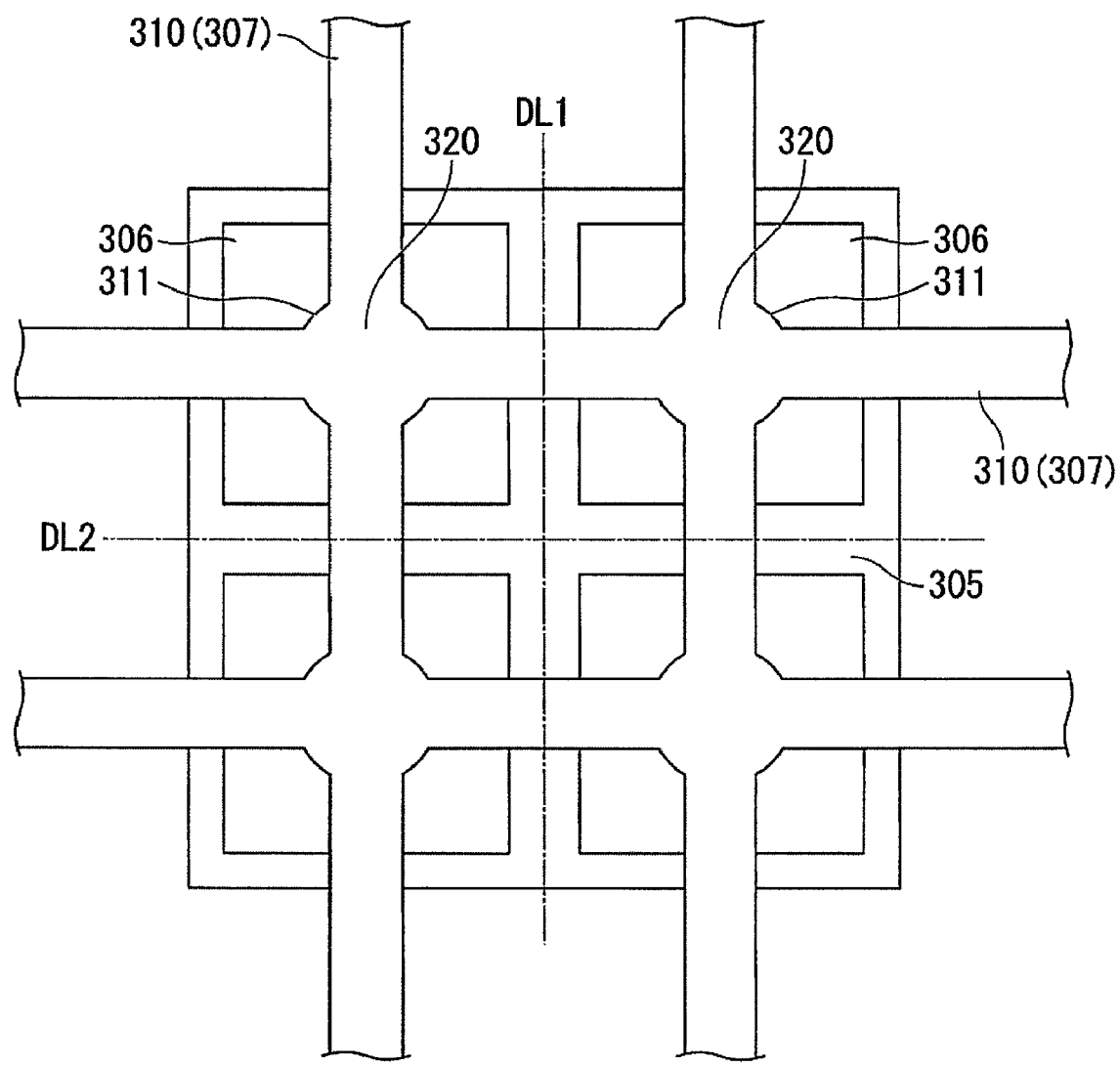
FIG. 4 is a top view showing a state before the division of a nitride semiconductor light-emitting device of the present invention.

FIG. 3 and FIG. 4 explain the method of producing a nitride semiconductor light-emitting device. The nitride semiconductor light-emitting device of the present invention can be obtained by dividing to a device unit along dicing lines DL1 and DL2.

The nitride semiconductor light-emitting device 1 of the Embodiment is obtained by stacking an n-type semiconductor layer 103, a light-emitting layer 104, a p-type semiconductor layer 105, a transparent electrode 106, an ohmic contact layer 107 (a metal film layer), a reflection layer 108, a plating adhesion layer 109, plated metal plate 110 in this order (up-and-down direction in FIG. 1).

In addition, in the nitride semiconductor light-emitting device 1, the reflection layer 108, the plating adhesion layer 109, the plated metal plate 110 are stacked on the transparent electrode 106 in this order. These layers are formed partially on the surface of the p-type semiconductor 105 in a cross shape. In other words, as shown in the latitude direction of FIG. 1 (left-to-right direction of FIG. 1) in the section line A-A shown in FIG. 3, the widths of the ohmic contact layer 107, the reflection layer 108, the plating adhesion layer 109 and the plated metal plate 110 are narrower than that of the transparent electrode 106, for example, the former is formed to about 30% of the latter. In addition, as shown in the altitude direction in FIG. 1 (depth direction to the paper surface in FIG. 1) the widths of the ohmic contact layer 107, reflection layer 108, plating adhesion layer 109 and plated metal plate 110 are the same as that of the transparent electrode 106. In addition, in the section line B-B shown in FIG. 3, as shown in FIG. 1, the widths in the latitude or altitude direction of the ohmic contact layer 107, reflection layer 108, plating adhesion layer 109 and plated metal plate 110 have a similar relationship to the above.

The model with top and bottom placement of electrode is obtained by forming a negative electrode 113 on the bottom surface of the n-type semiconductor layer 103 through intermediary of a transparent electrode 112 and forming a positive electrode 111 on the top surface of the plated metal plate 110.

A procedure to produce a nitride semiconductor light-emitting device of the present invention is described below by using examples shown in FIG. 2 and FIG. 3.

Firstly, a buffer layer 202 is formed on a sapphire substrate (a substrate) 201, and an n-type semiconductor layer 203, a light-emitting layer 204, a p-type semiconductor layer 205 are stacked on the buffer layer 202, to form a nitride semiconductor layer. A transparent electrode 206 is formed on the resulting nitride semiconductor layer (that is, the p-type semiconductor layer 205). The n-type semiconductor layer 203, light-emitting layer 204, p-type semiconductor layer 205 and transparent electrode 206 are almost formed the same size as each other as shown in FIG. 2, not only in the latitude direction but also in the altitude direction. Secondly, an ohmic contact layer 207 and reflection layer 208 the stacked on the transparent electrode 206 in this order. An ohmic contact layer 207 and a reflection layer 208 are stacked partially on the transparent electrode 206 to form a grid pattern from a top view, and the device units are intersected by the grid pattern in the latitude and altitude direction as shown in FIG. 3. As the method of forming the pattern of the ohmic contact layer 207 and reflection layer 208, a well-known photolithographic method which is described below by using a resist material or lift-off method can be used.

A plated metal plate 210 is formed by plating. In this Embodiment, the plated metal plate 210 is formed by plating after coating an insulation film on the part which is not plated other than the part of the ohmic contact layer 207 and reflection layer 208, or by plating after patterning a thick film resist material by a well-known photolithography technique or lift-off technique in order to only expose the ohmic contact layer 207 and a reflection layer 208. In addition, it is preferable to form a plating adhesion layer 209 to improve adhesion between the plated metal plate 210 and reflection layer 208 (a metal film layer) before plating. However, the plating adhesion layer 209 can be omitted.

Further, the sapphire substrate 201 is exfoliated, and a buffer layer 202 is also removed. Next, the positive electrode 111 and negative electrode 113 shown in FIG. 1 are formed by forming a positive and a negative electrode. And a nitride semiconductor light-emitting device 1 shown in FIG. 1 can be obtained by dividing the plated metal plate 210 to a device unit along dicing lines DL1 and DL2 as shown in FIG. 3.

A nitride semiconductor light-emitting device of the present is obtained as shown in FIG. 1. The stacked layers of an ohmic contact layer 107, a reflection layer 108, a plating adhesion layer 109 and a plated metal plate 110 on a p-type semiconductor layer 105 through a transparent electrode 106, are formed partially in a cross pattern on the p-type semiconductor layer 105 through the transparent electrode 106.

It is preferable that the ratio of the area of the ohmic contact layer 107, the reflection layer 108, the plating adhesion layer 109 and the plated metal plate 110, which is the area of a bottom 107a of the ohmic contact layer 107, to the area of a top surface 105a of the p-type semiconductor layer 105 is in a range of 10-90%. As shown in a cross-sectional view in FIG. 3, the width of the bottom 107a of the ohmic contact layer 107 in the latitude direction (left-to-right direction of FIG. 1) is about 30% of the width of the top surface 105a of the p-type semiconductor layer 105, which is the same width as a top surface 106a of the transparent electrode 106 formed. As shown in the top view in FIG. 3, the plated metal plate 210, the ohmic contact layer 207 and the reflection layer 208 are stacked on the transparent electrode 206 (p-type semiconductor layer 205) and form a grid pattern which crosses in length and breadth directions in each device unit. The length or breadth of the grid lines is about 30% as wide as the width of the device unit. The ratio of the area of the grid pattern to the area of each device unit of the p-type semiconductor 205, or transparent electrode 206 is about 50%.

In addition, as shown in FIG. 4, in the nitride semiconductor light-emitting device of the present invention, a cross part 320 of a plated metal plate 310 and an ohmic contact layer 307, which form a grid pattern from top view and cross in length and breadth directions in each device unit, preferably shows a circle shape which has a bulged bulge part 311.

Examples of a material for the substrate 201 include oxide single crystals such as sapphire single crystal ($Al_2O_3$; A plane, C plane, M plane, and R plane), spinel single crystal ($AgAl_2O_4$), ZnO single crystal, $LiAlO_2$ single crystal, $LiGaO_2$ single crystal, and MgO single crystal; and a conventional substrate material such as Si single crystal, SiC single crystal and GaAs single crystal. These materials can be used for the substrate without any limitation. When a conductive substrate such as a substrate made of SiC is used as the substrate 201, it is not necessary to remove the substrate when producing a light-emitting device comprising positive and negative electrodes on both surfaces thereof. However, since the buffer layer 202, which is insulating, cannot be used, and crystals of the semiconductor stacked layers grown on the sapphire substrate 201 are degraded, a light-emitting device having excellent properties cannot be produced. Therefore, it is necessary to remove the sapphire substrate 201 even when conductive Sic or Si is used for the substrate in the present invention.

The buffer layer 202 is formed from AlN or AlGaN, which has a lattice constant between the lattice constants of sapphire single crystal constituting the substrate and GaN, to improve the crystallinity of the GaN, because the lattice constant of sapphire single crystal and the lattice constant of GaN single crystal differ by 10%. AlN and AlGaN are used without limitation in the present invention at all.

The nitride semiconductor having a hetero-junction structure is made from at least the n-type semiconductor layer 103, the light-emitting layer 104, and the p-type semiconductor layer 105. As the nitride semiconductor, many nitride semiconductors denoted by the general formula: $Al_xIn_yGa_{1-x-y}N$ ($0 \leq x < 1$, $0 \leq y < 1$, $x+y < 1$) are known. In the present invention, nitride semiconductors denoted by the general formula $Al_xIn_yGa_{1-x-y}N$ ($0 \leq x < 1$, $0 \leq y < 1$, $x+y < 1$) can be used without any limitation.

Production methods of these nitride semiconductors are not limited. The present invention can use all methods which are known as methods for growing Group-III nitride semiconductors such as a metal organic chemical vapor deposition method (MOCVD), hydride vapor phase epitaxy (HPVE), and molecular beam epitaxy method (MBE). Among these, from the viewpoint of controllability of the thickness of a film, and mass productivity, MOCVD is preferable.

When MOCVD is used, it is preferable that hydrogen ($H_2$) or nitrogen ($N_2$) be used as a carrier gas; that trimethylgallium (TMG) or triethylgallium (TEG) be used as a Ga source which is a Group-III source material; that trimethylaluminum (TMA) or triethylaluminum (TEA) be used as an Al source; that trimethylindium (TMI) or triethylindium (TEI) be used as an In source; and that ammonia ($NH_3$) or hydrazine ($N_2H_4$) be used as a N source which is a group-V source material.

As an n-type dopant, for example, monosilane ($SiH_4$) or disilane ($Si_2H_6$) is preferably used as a Si source, and germanium ($GeH_4$) is preferably used as a Ge source. As a p-type dopant, for example, biscyclopentadienyl magnesium ($Cp_2Mg$) or bisethylcyclopentadienyl magnesium ($(EtCp)_2Mg$) is used as a Mg source.

For a method of dividing a nitride semiconductor on a sapphire substrate, well-known techniques such as etching method, laser cutting method can be used without limitation at all. When a laser lift-off method is used, when a nitride semiconductor is divided, it is preferable to remove the substrate well in order to avoid damaging the sapphire substrate. When it is divided by an etching method, it is preferable to etch the sapphire substrate at a slow etch rate because a nitride semiconductor has a rapid etching rate. When it is divided by a laser, it is preferable to use the laser at wavelength of 300 to 400 nm, which is different from an absorption wavelength of GaN and sapphire.

The ohmic contact layer 107 is required to have a low contact resistance to the p-type nitride semiconductor layer 105.

With respect to the contact resistance to the p-type nitride semiconductor layer 105, an element of the platinum group such as Pt, Ru, Os, Rh, Ir, and Pd, or Ag is preferable as a material for the ohmic contact layer 107. Among these, Pt, Ir, Rh, and Ru are more preferable, and Pt is most preferable.

When Ag is used for the ohmic contact layer 107, excellent reflectivity is obtained. However, there is a problem in that the contact resistance of Ag is higher than that of Pt. However, Ag can be used in devices in which a high contact resistance is not required.

However, when the transparent electrode 106 is formed on the p-type semiconductor layer 105, it is possible to use Ti, V, Cr, Co, Ni, Zr, Nb, Mo, Hf, Ta, W besides the above materials for the ohmic contact layer 107, because a contact resistance between the transparent electrode 106 and p-type semiconductor layer 105 is large, and a contact resistance between the transparent electrode 106 and ohmic contact layer 107 decreases.

To stably obtain a low contact resistance, the thickness of the ohmic contact layer 107 is preferably 0.1 nm or greater, and more preferably 1 nm or greater. When it is 1 nm or greater, a uniform contact resistance can be obtained.

Then, the reflection layer 108 is formed on the ohmic contact layer 107 to improve the reflectivity of light. The reflection layer 108 is preferably made of an Ag alloy, or an Al alloy. An Ag alloy has a higher reflectivity than Pt, Ir, Rh, Ru, Os, and Pd in the visible to ultraviolet wavelengths. That is, since light from the light-emitting layer 104 is sufficiently reflected, a high-powered device can be produced using the reflection layer made of an Ag alloy or Al alloy. In addition, when the reflection layer 108 is made of an Ag alloy or an Al alloy, and the ohmic contact layer 107 is made thin enough for light to pass sufficiently there through, sufficient reflected light can be obtained in addition to obtaining an excellent ohmic contact. Therefore, a high-powered light-emitting device can be produced. The thickness of the ohmic contact layer 107 is preferably 30 nm or less, and more preferably 10 nm or less.

As the method for producing the ohmic contact layer 107 and the reflection layer 108, conventional sputtering methods and deposition methods can be used without any limitation.

It is preferable to use an Ag alloy for the reflection layer 108.

It is preferable that the film thickness of reflection layer 108 be more than 0.1 nm to obtain a good reflectance. In order to obtain good reflectance, it is more preferable that the thickness be more than 1 nm. In addition, it is preferable that the thickness of an Ag alloy layer be thin because migration occurs easily in the Ag layer even if the Ag layer is protected by plating. It is more preferable that the thickness of the Ag layer be equal to or less than 200 nm.

As the method of formation of a reflection layer 108, a well-known sputter method or an evaporation method can be used without limitation in particular. The film with a strong adhesion can be obtained when the sputter method is used because a sputter particle with a high energy collides against a substrate surface. Thus, it is preferable to use a sputter method.

As a material used for the transparent electrode 106, well-known materials such as ITO (an In—Sn—O alloy), IZO (an In—Zn—O alloy), AZO (a Zn—Al—O alloy) can be used without limitation at all.

As the thickness of the transparent electrode 106, more than 100 nm is preferable in order to obtain a low contact resistance. The output power deteriorates when the transparent electrode 106 is too thick because it can absorb light. Thus, it is more preferable that the transparent electrode 106 be equal to or less than 1 μm.

In addition, it is preferable that the transparent electrode 106 be formed on the entire surface of the p-type semiconductor layer from the viewpoint of current diffusion.

As the method of formation of transparent electrode 106, a well-known sputter method and evaporation method can be used without limitation in particular. Particularly, an annealing treatment at a temperature of range of 100° C. to 300° C. after formation of a film is effective to increase a transmission factor and decrease sheet resistance.

It is preferable to form the plating adhesion layer 109 directly under the plated metal plate 110, that is between the plated metal plate 110 and reflection layer 108, in order to improve the adhesion. As a material of the plating adhesion layer 109, it depends on the material of the plated metal plate 110, and the material which is contained as a main component in the plated metal plate 110 can be mostly contained in order to improve the adhesion. For example, it is preferable that the material which be the same as the main component which is contained equal to or more than 50% by weight of the plated metal plate 110, is contained equal to or more than 50% by weight of the a plating adhesion layer 109.

When the plated metal plate 110 is made by plating NiP, the plating adhesion layer is preferably made of a Ni alloy, and more preferably made of NiP. In addition, when the plated metal plate 110 is made by plating Cu, the plating adhesion layer 110 is preferably made of a Cu alloy, and more preferably made of Cu.

In order to obtain excellent adhesion, the thickness of the plating adhesion layer 109 is preferably 0.1 nm or greater, and more preferably 1 nm or greater. Although there is no upper limit to the thickness of the plating adhesion layer 109, the upper limit of the thickness is preferably 2 μm or less from the point of view of productivity.

The production method for the plating adhesion layer 109 is not limited, and examples thereof include a conventional sputtering method and deposition method. Since sputtered particles having high energy hit the surface of a base to form a film in the sputtering method, it is possible to form a film having high adhesion. Therefore, a sputtering method is preferably used to form the plating adhesion layer 109.

The plated metal plate 110 is formed by an electroless plating method or electrolysis plating method. When an electroless plating method is used, it is preferable to plate a NiP alloy. In contrast, when an electrolysis plating method is used, it is preferable to plate Cu. In order to maintain sufficient strength as a plate, the thickness of the plated metal plate 110 is preferably 10 μm or greater. However, if the plated metal plate 110 is too thick, the plated metal plate 110 easily peels and productivity decreases; therefore, the thickness is preferably 200 μm or less.

Before plating, it is preferable to degrease and wash the surface of the nitride semiconductor device using widely used neutral detergents. In addition, it is also preferable to chemically etch the surface of the plating adhesion layer using acids such as nitric acid to remove a natural oxide film on the plating adhesion layer.

When the plated metal plate is made by NiP plating, the plated metal plate is preferably formed by electroless plating using a plating bath comprising a source of nickel such as nickel sulfate and nickel chloride, and a phosphorous source such as hypophosphite. Examples of a suitable commercialized product of a plating bath used in electroless plating include NIMUDEN® HDX marketed by Uemura & Co., Ltd. The pH of the plating bath during electroless plating is preferably in a range from 4 to 10, and the temperature thereof is preferably in a range from 30 to 95° C.

When the plated metal plate is made by plating Cu or a Cu alloy, the plated metal plate is preferably formed by electrolysis plating using a plating bath comprising a source of Cu such as copper sulfate. The plating bath during electrolysis plating is preferably strongly acidic, that is, the pH thereof is preferably 2 or less. The temperature thereof is preferably in a range from 10 to 50° C. and more preferably room temperature (25° C.). The current density is preferably in a range from 0.5 to 10 A/dm$^2$, and more preferably in a range from 2 to 4 A/dm$^2$.

In addition, in order to make the surface smooth, a leveling agent is preferably added to the plating bath. Examples of a commercialized product of a leveling agent used include ETN-1-A and ETN-1-B, marketed by Uemura & Co., Ltd.

In order to improve adhesion of the plating metal layer 110, it is preferable to anneal the plated metal plate 110. The annealing temperature is preferably in a range from 100 to 300° C. to improve adhesion. If the annealing temperature is more than the above range adhesion may be further improved, but ohmic properties may be degraded.

As a method of forming the ohmic contact layer 107, reflection layer 108 (a metal film layer), and plated metal plate 110 partially on the p-type semiconductor layer 105 (transparent electrode 106), several methods are considered.

As a method of forming the ohmic contact layer 107, reflection layer 108 partially, a well-known photo lithographic technique and lift-off technique can be used.

As a method of forming the plated metal plate 110 partially, the two following methods are mainly considered.
(1) An insulating protection film is formed on the part other than the ohmic contact layer 107 and reflection layer 108. As a result, plating is formed only on the patterned ohmic contact layer 107 and reflection layer 108 because plating cannot be formed on an insulating film.
(2) A thick film resist material for plating is used in a well-known photolithography technique and lift-off technique.

As a pattern of the ohmic contact layer 107, reflection layer 108, pattern shape of plated metal plate 110, it is necessary to keep the balance of two inconsistent characteristics, one of which is decreasing the area of the each layers of the p-type semiconductor layer 105 as much as possible, and the other of which is holding the strength of the plated metal plate 110 as a substrate as much as possible.

It is preferable that the formed pattern of the ohmic contact layer 107, reflection layer 108, and plated metal plate 110 be a cross as shown in FIG. 3 and FIG. 4 in a view of holding strength of the substrate while decreasing the occupied area of the p-type semiconductor layer 105 as much as possible.

However, as a pattern of the ohmic contact layer 107, reflection layer 108, and plated metal plate 110, it is not limited to a pattern shown in FIG. 3 or FIG. 4. It is preferable that a pattern on the transparent electrode 106 be a shape of grid, mesh, crossline, comb, round ring, square ring, Y or L, which can be decided appropriately according to the strength of the substrate and installation characteristics of metal pads to be described below.

It is also preferable to form a wide area which metal pads are attached to, in order to make it easy to set a bonding wire. For example, as shown in FIG. 4, it is preferable to form a rough circle pattern from a top view having a bulge 311 in the cross part 320 of plated metal plate 310 at the center of a device unit in order to set a bonding wire.

After the formation of the plated metal plate 110, a sapphire substrate (sapphire substrate 201 in FIG. 2) is exfoliated. Examples of a method to exfoliate a sapphire substrate include any conventional methods such as a polishing method, etching method, a laser-lift-off method.

After a sapphire substrate is exfoliated, the buffer layer (buffer layer 202 in FIG. 2) is removed by a polishing method or etching method, or the like, and the n-type semiconductor layer 103 is exposed. A negative electrode, which is abbreviated for illustration in figures, is formed on the n-type semiconductor layer 103. As the negative electrode, conventional negative electrodes having various compositions and structures can be used without any limitation.

As the positive electrode formed, various positive electrodes comprising Au, Al, Ni, Cu, and the like are known. In the present invention, this conventional positive electrodes can be used without any limitation.

Second Embodiment

Another embodiment of a nitride semiconductor compound light-emitting device of the present invention is explained referring to figures.

Figure 5:
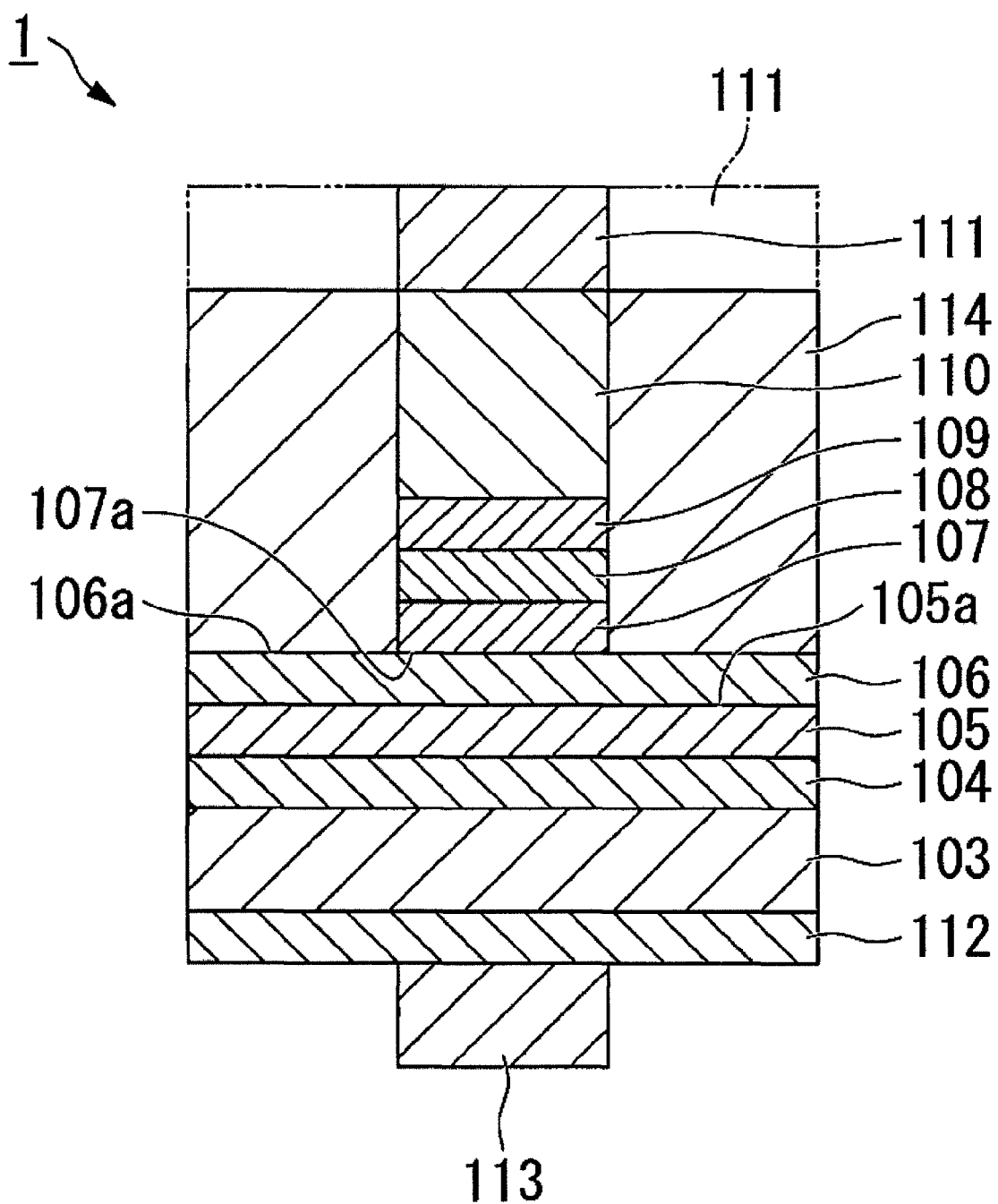
FIG. 5 is a view showing a cross-sectional structure of the nitride-based compound semiconductor light-emitting device of the present invention as an example.
Figure 6:
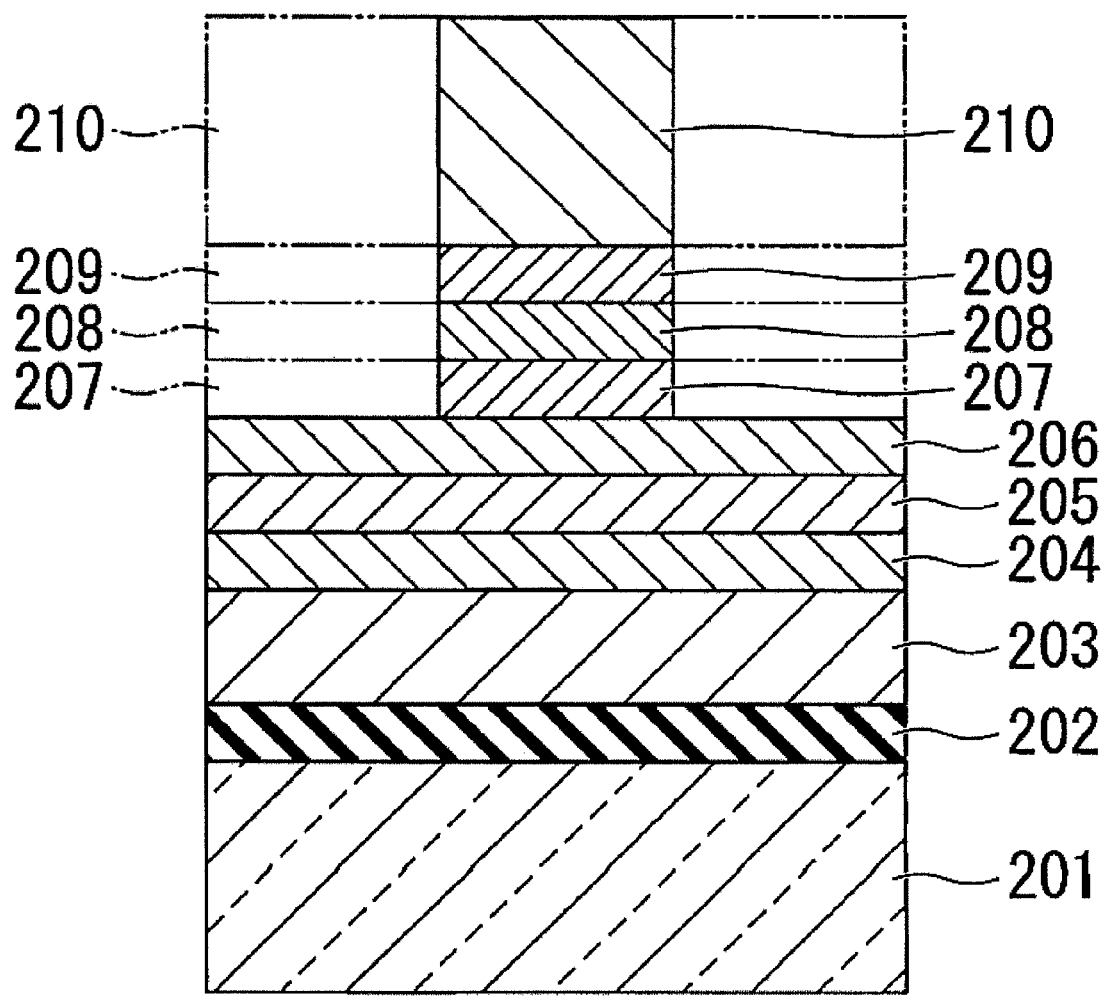
FIG. 6 is a view of a cross-sectional structure for explaining a production method for a nitride semiconductor light-emitting device of the present invention.

FIG. 5 to FIG. 8 are figures explaining a nitride semiconductor light-emitting device of the present example, and FIG. 5 is a cross-sectional view showing an example of a nitride semiconductor light-emitting device of the present invention, in which an n-type semiconductor layer, a light-emitting layer and a p-type semiconductor layer are formed, and on these layers, an ohmic layer, a reflection layer and a plating adhesion layer are formed, and on these layers, a plated metal plate is formed. FIG. 6 is figure to explain the method to produce a nitride semiconductor light-emitting device as an example. In the embodiment, the nitride semiconductor layer shown in FIG. 6 was formed before the formation of the structure of top and bottom placement of electrodes shown in FIG. 5. In addition, the two-dotted lines shown in FIG. 5 show the part of the cross shape from the top view formed by a positive electrode on a plated metal plate. The two-dotted lines shown in FIG. 6 show the part of the cross shape from the top view formed by an ohmic layer, a reflection layer, a plating adhesion layer, and a plated metal plate.

Figure 7:
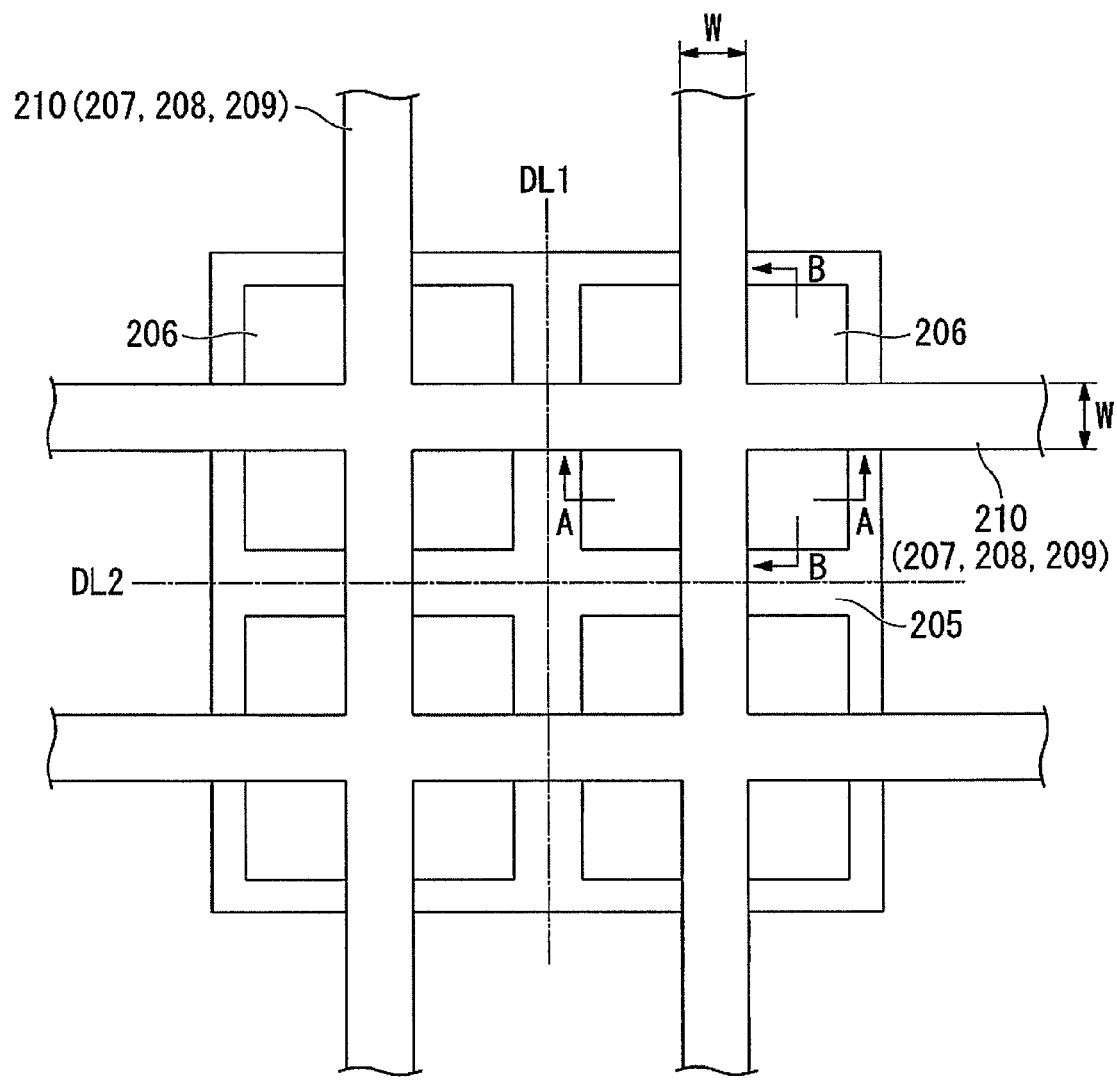
FIG. 7 is a top view showing a state before the division of a nitride semiconductor light-emitting device of the present invention.
Figure 8:
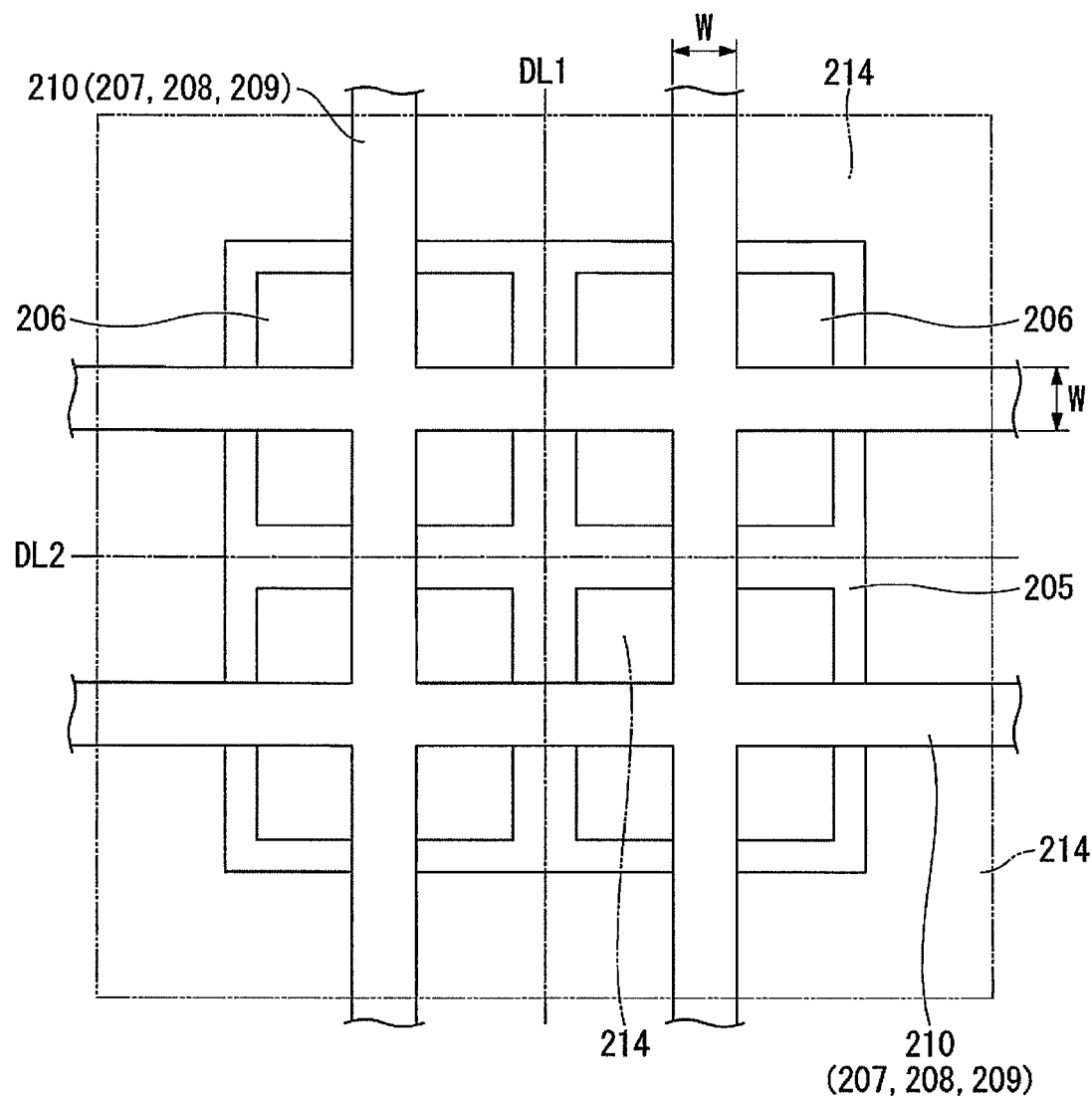
FIG. 8 is a top view showing a state before the division of a nitride semiconductor light-emitting device of the present invention.
Figure 9:
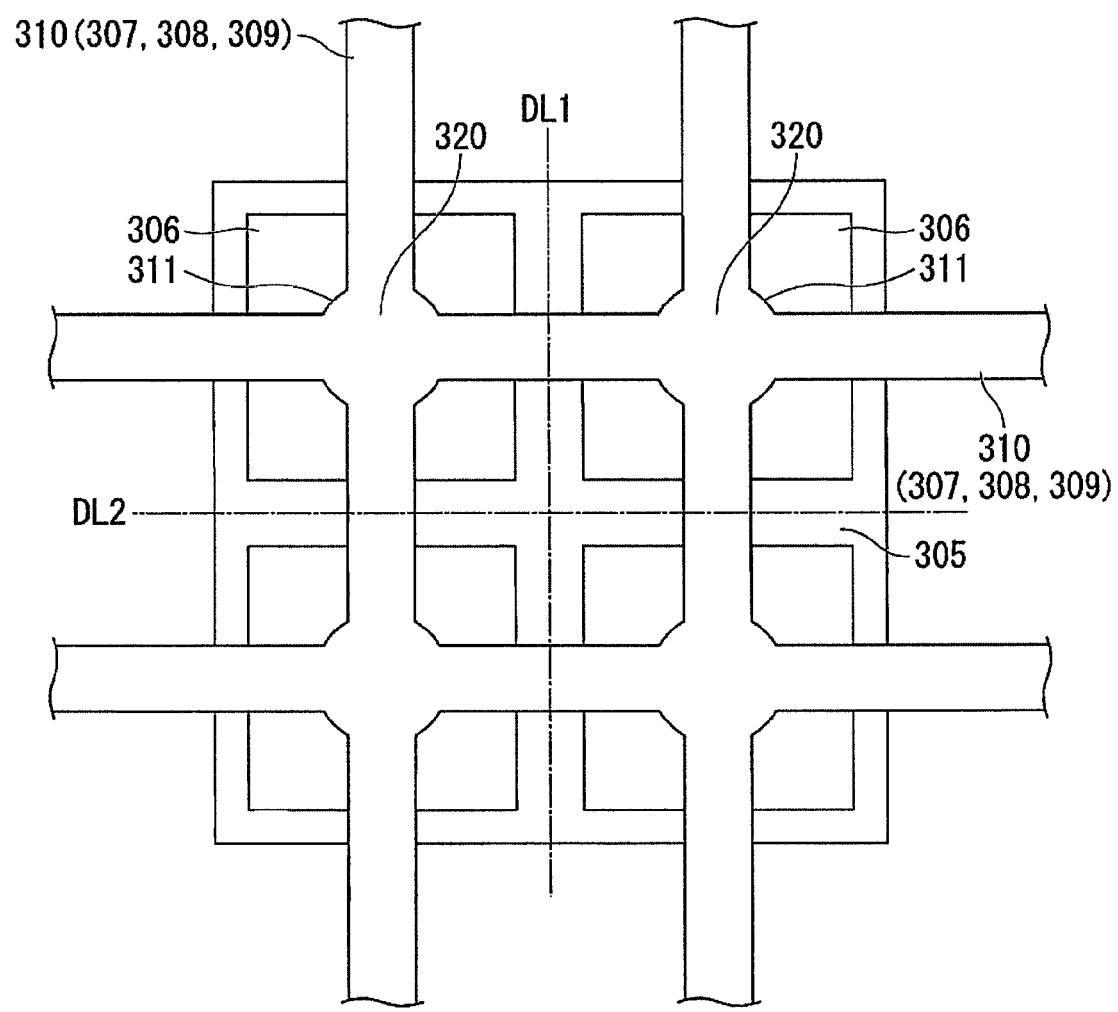
FIG. 9 is a top view showing a state before the division of a nitride semiconductor light-emitting device of the present invention.

FIGS. 7 to 9 are figures showing the method of producing a nitride semiconductor light-emitting device. The nitride semiconductor light-emitting device of the present invention can be obtained by dividing to a device unit along dicing lines DL1 and DL2.

The nitride semiconductor light-emitting device 1 of the Embodiment is obtained by stacking the n-type semiconductor layer 103, light-emitting layer 104, p-type semiconductor layer 105, transparent electrode 106, ohmic contact layer 107 (a metal film layer), reflection layer 108, plating adhesion layer 109, plated metal plate 110 in this order (up-and-down direction in FIG. 5).

In addition, in the nitride semiconductor light-emitting device 1, the reflection layer 108, plating adhesion layer 109, plated metal plate 110 are stacked on the transparent electrode 106 in this order. These layers are formed partially on the surface of the p-type semiconductor 105 in a cross shape. In other words, as shown in the latitude direction of FIG. 5 (left-to-right direction of FIG. 5) in the section line A-A shown in FIG. 7, the widths of the ohmic contact layer 107, reflection layer 108, plating adhesion layer 109 and plated metal plate 110 are narrower than that of the transparent electrode 106, for example, the former is formed to about 30% of the latter. In addition, as shown in the altitude direction in FIG. 5 (depth direction to the paper surface in FIG. 5) the widths of the ohmic contact layer 107, reflection layer 108, plating adhesion layer 109 and plated metal plate 110 are the same as that of the transparent electrode 106. In addition, in the section line B-B shown in FIG. 7, as shown in FIG. 5, the widths in the latitude or altitude direction of the ohmic contact layer 107, reflection layer 108, plating adhesion layer 109 and plated metal plate 110 have a similar relationship to above.

In addition, in this Embodiment, a light-permeable material layer 114 is formed on the transparent electrode 106 in the region where the ohmic contact layer 107, reflection layer 108, plating adhesion layer 109 and plated metal plate 110 are not formed.

The model with top and bottom placement of an electrode is obtained by forming the negative electrode 113 on the bottom surface of the n-type semiconductor layer 103 through an intermediary of the transparent electrode 112 and forming the positive electrode 111 on the top surface of the plated metal plate 110.

A procedure to produce a nitride semiconductor light-emitting device of the present invention is described below by using examples shown in FIG. 6, FIG. 7 and FIG. 8.

Firstly, the buffer layer 202 is formed on the sapphire substrate (a substrate) 201, and the n-type semiconductor layer 203, light-emitting layer 204, p-type semiconductor layer 205 are stacked on the buffer layer 202, to form a nitride semiconductor layer. The transparent electrode 206 is formed on the resulting nitride semiconductor (that is, p-type semiconductor layer 205). The n-type semiconductor layer 203, light-emitting layer 204, p-type semiconductor layer 205 and transparent electrode 206 are formed almost the same size as each other as shown in FIG. 6, not only in the latitude direction but also in the altitude direction.

Secondly, the ohmic contact layer 207 and reflection layer 208 are stacked on the transparent electrode 206 in this order. The ohmic contact layer 207 and reflection layer 208 are stacked partially on the transparent electrode 206 to form a grid pattern from a top view, and the device units are intersected by the grid pattern in latitude and altitude directions as shown in FIG. 7. As the method of forming the pattern of the ohmic contact layer 207 and reflection layer 208, a well-known photolithographic method described below by using a resist material or lift-off method can be used.

The plated metal plate 210 is formed by plating. In this Embodiment, the plated metal plate 210 is formed by plating after coating an insulation film on the part which is not plated other than the part of the ohmic contact layer 207 and reflection layer 208, or plating after patterning a thick film resist material by a well-known photolithography technique or lift-off technique in order to only expose ohmic contact layer 207 and reflection layer 208. In addition, it is preferable to form the plating adhesion layer 209 to improve adhesion between the plated metal plate 210 and reflection layer 208 (a metal film layer) before plating. However, the plating adhesion layer 209 can be omitted.

Next, as shown in FIG. 8, a light-permeable material layer 214 is formed on the transparent electrode 206 in the region where the ohmic contact layer 207, reflection layer 208, plating adhesion layer 209 and plated metal plate 210 are not formed. As an example shown in FIG. 8, the light-permeable material layer 214 is formed without a gap on the transparent electrode 206 in the region where the ohmic contact layer 207, reflection layer 208, plating adhesion layer 209 and plated metal plate 210, which are formed in a cross shape from the top view, are not formed.

Further, the sapphire substrate 201 is exfoliated, and the buffer layer 202 is also removed. Next the positive electrode 111 and negative electrode 113 shown in FIG. 5 are formed by forming positive and negative electrodes. And the nitride semiconductor light-emitting device 1 shown in FIG. 5 can be obtained by dividing the plated metal plate 210 to a device unit along dicing lines DL1 and DL2 as shown in FIG. 7.

A nitride semiconductor light-emitting device of the present is obtained as shown in FIG. 5. The stacked layers of the ohmic contact layer 107, reflection layer 108, plating adhesion layer 109 and plated metal plate 110 on the p-type semiconductor layer 105 through the transparent electrode 106, are formed partially in a cross pattern on the p-type semiconductor layer 105 through the transparent electrode 106.

In addition, the light-permeable material layer 114 is formed on the transparent electrode 106 in the region where the ohmic contact layer 107, reflection layer 108, plating adhesion layer 109 and plated metal plate 110 are not formed.

It is preferable that the ratio of the area of the ohmic contact layer 107, the reflection layer 108, the plating adhesion layer 109 and the plated metal plate 110, which is the area of the bottom 107a of the ohmic contact layer 107, to the area of top surface 105a of the p-type semiconductor layer 105 be in a range of 10 to 90%.

As shown in a cross-sectional view in FIG. 5, the width of the bottom 107a of the ohmic contact layer 107 in the latitude direction (left-to-right direction of FIG. 5) is about 30% of the width of the top surface 105a of the p-type semiconductor layer 105, which is the same as the width of the top surface 106a of the transparent electrode 106 formed. As shown in the top view in FIG. 7 and FIG. 8, the plated metal plate 210, the ohmic contact layer 207 and the reflection layer 208 are stacked on the transparent electrode 206 (p-type semiconductor layer 205) and form a grid pattern which crosses in length and breadth directions in each device unit. The length or breadth of the grid lines is about 30% as wide as the width of the device unit. The ratio of the area of the grid pattern to the area of each device unit of the p-type semiconductor 205, or transparent electrode 206 is about 50%.

In addition, as shown in FIG. 9, in the nitride semiconductor light-emitting device of the present invention, the cross part 320 of the plated metal plate 310 and the ohmic contact layer 307, which form the grid pattern from the top view which crosses in length and breadth directions in each device unit, preferably shows a circle shape which has the bulged bulge part 311.

Examples of a material for the substrate 201 include oxide single crystals such as sapphire single crystal ($Al_2O_3$; A plane, C plane, M plane, and R plane), spinel single crystal ($AgAl_2O_4$), ZnO single crystal, $LiAlO_2$ single crystal, $LiGaO_2$ single crystal, and MgO single crystal; and a conventional substrate material such as Si single crystal, SiC single crystal, and GaAs single crystal. These materials can be used for the substrate without any limitation. When a conductive substrate such as a substrate made of SiC is used as the substrate 201, it is not necessary to remove the substrate when producing a light-emitting device comprising positive and negative electrodes on both surfaces thereof. However, since buffer layer 202, which is insulating, cannot be used, and crystals of the semiconductor stacked layers grown on the sapphire substrate 201 are degraded, a light-emitting device having excellent properties cannot be produced. Therefore, it is necessary to remove the sapphire substrate 201 even when conductive Sic or Si is used for the substrate in the present invention.

The buffer layer 202 is formed from AlN or AlGaN, which has a lattice constant between the lattice constants of sapphire single crystal constituting the substrate and GaN, to improve the crystallinity of the GaN, because the lattice constant of sapphire single crystal and the lattice constant of GaN single crystal differ by 10%. AlN and AlGaN are used without limitation in the present invention at all.

The nitride semiconductor having a hetero-junction structure is made from at least the n-type semiconductor layer 103, the light-emitting layer 104, and the p-type semiconductor layer 105. As the nitride semiconductor, many nitride semiconductors denoted by the general formula: $Al_xIn_yGa_{1-x-y}N$ ($0 \leq x<1s$, $0 \leq y<1s$, $x+y<1$) are known. In the present invention, nitride semiconductors denoted by the general formula $Al_xIn_yGa_{1-x-y}N$ ($0 \leq x<1$, $0 \leq y<1$, $x+y<1$) can be used without any limitation.

Production methods of these nitride semiconductors are not limited. The present invention can use all methods which are known for growing Group-III nitride semiconductors such as a metal organic chemical vapor deposition method (MOCVD), hydride vapor phase epitaxy (HPVE), and molecular beam epitaxy method (MBE). Among these, from the viewpoint of controllability of the thickness of a film, and mass productivity, MOCVD is preferable.

When MOCVD is used, it is preferable that hydrogen ($H_2$) or nitrogen ($N_2$) be used as a carrier gas; that trimethylgallium (TMG) or triethylgallium (TEG) be used as a Ga source which is a Group-III source material; that trimethylaluminum (TMA) or triethylaluminum (TEA) be used as an Al source; that trimethylindium (TMI) or triethylindium (TEI) be used as an In source; and that ammonia ($NH_3$) or hydrazine ($N_2H_4$) be used as a N source which is a group-V source material.

As an n-type dopant, for example, monosilane ($SiH_4$) or disilane ($Si_2H_6$) is preferably used as a Si source, and germanium ($GeH_4$) is preferably used as a Ge source. As a p-type dopant, for example, biscyclopentadienyl magnesium ($Cp_2Mg$) or bisethylcyclopentadienyl magnesium (($EtCp)_2Mg$) is used as a Mg source.

For a method of dividing a nitride semiconductor on a sapphire substrate, well-known techniques such as an etching method, laser cutting method can be used without limitation at all. When a laser lift-off method is used, when a nitride semiconductor is divided, it is preferable to remove the substrate well in order to avoid damaging the sapphire substrate. When it is divided by an etching method, it is preferable to etch the sapphire substrate at a slow etch rate because a nitride semiconductor has a rapid etch rate. When it is divided by a laser, it is preferable to use the laser at a wavelength of 300 nm to 400 nm, which is different from an absorption wavelength of GaN and sapphire.

The ohmic contact layer 107 is required to have a low contact resistance to the p-type nitride semiconductor layer 105.

With respect to the contact resistance to the p-type nitride semiconductor layer 105, an element of the platinum group such as Pt, Ru, Os, Rh, Ir, and Pd, or Ag is preferable as the material for the ohmic contact layer 107. Among these, Pt, Ir, Rh, and Ru are more preferable, and Pt is most preferable.

When Ag is used for the ohmic contact layer 107, excellent reflectivity is obtained. However, there is a problem in that the contact resistance of Ag is higher than that of Pt. However, Ag can be used in devices in which a high contact resistance is not required.

However, when the transparent electrode 106 is formed on the p-type semiconductor layer 105, it is possible to use Ti, V, Cr, Co, Ni, Zr, Nb, Mo, Hf, Ta, W besides the above materials for the ohmic contact layer 107, because a contact resistance between the transparent electrode 106 and p-type semiconductor layer 105 is large, and a contact resistance between transparent electrode 106 and ohmic contact layer 107 decreases.

To stably obtain a low contact resistance, the thickness of the ohmic contact layer 107 is preferably 0.1 nm or greater, and more preferably 1 nm or greater. In particular, when the thickness of the ohmic contact layer 107 is 1 nm or greater, a uniform contact resistance can be obtained.

Then, the reflection layer 108 is formed on the ohmic contact layer 107 to improve the reflectivity of light. The reflection layer 108 is preferably made of an Ag alloy, or an Al alloy. An Ag alloy has a higher reflectivity than Pt, Ir, Rh, Ru, Os, and Pd in the visible to ultraviolet wavelengths. That is, since light from the light-emitting layer 104 is sufficiently reflected, a high-powered device can be produced using the reflection layer 108 made of an Ag alloy or Al alloy. In addition, when the reflection layer 108 is made of an Ag alloy or an Al alloy, and the ohmic contact layer 107 is made thin enough for light to pass sufficiently there through, sufficient reflected light can be obtained in addition to obtaining an excellent ohmic contact. Therefore, a high-powered light-emitting device can be produced. The thickness of the ohmic contact layer 107 is preferably 30 nm or less, and more preferably 10 nm or less.

As the method for producing the ohmic contact layer 107 and the reflection layer 108, conventional sputtering methods and deposition methods can be used without any limitation.

It is preferable to use an Ag alloy for the reflection layer 108.

It is preferable that the film thickness of reflection layer 108 be more than 0.1 nm to obtain a good reflectance. In order to obtain good reflectance, it is more preferable that the thickness be more than 1 nm. In addition, it is preferable that the thickness of an Ag alloy layer be thin because migration occurs easily in the Ag layer even if the Ag layer is protected by plating. It is more preferable that the thickness of the Ag layer be equal to or less than 200 nm.

As the method of formation of the reflection layer 108, a well-known sputter method or an evaporation method can be used without limitation in particular. The film with a strong adhesion can be obtained when the sputter method is used because a sputter particle with high energy collides against a substrate surface. Thus, it is preferable to use a sputter method.

As a material used for the transparent electrode 106, well-known materials such as ITO (an In—Sn—O alloy), IZO (an In—Zn—O alloy), AZO (a Zn—Al—O alloy) can be used without limitation at all.

As the thickness of the transparent electrode 106, more than 100 nm is preferable in order to obtain a low contact resistance. The output power deteriorates when the transparent electrode 106 is too thick because it can absorb light. Thus, it is more preferable that the transparent electrode 106 be equal to or less than 1 μm.

In addition, it is preferable that the transparent electrode 106 be formed on the whole surface of the p-type semiconductor layer from the viewpoint of current diffusion.

As the method of formation of the transparent electrode 106, a well-known sputter method and evaporation method can be used without limitation in particular. Particularly, an annealing treatment at temperature range of 100° C. to 300° C. after formation of a film is effective to increase a transmission factor and decrease sheet resistance.

It is preferable to form a plating adhesion layer 109 directly under the plated metal plate 110, that is between the plated metal plate 110 and reflection layer 108, in order to improve the adhesion. As a material of the plating adhesion layer 109, it depends on the material of the plated metal plate 110, and the material which is contained as a main component in the plated metal plate 110 can be mostly contained in order to improve the adhesion. For example, it is preferable that the material which is the same as the main component which is contained equal to or more than 50% by weight by a plated metal plate 110, be contained equal to or more than 50% by weight of the plating adhesion layer 109.

When the plated metal plate 110 is made by plating NiP, the plating adhesion layer is preferably made of a Ni alloy, and more preferably made of NiP. In addition, when the plated metal plate 110 is made by plating Cu, the plating adhesion layer 110 is preferably made of a Cu alloy, and more preferably made of Cu.

In order to obtain excellent adhesion, the thickness of the plating adhesion layer 109 is preferably 0.1 nm or greater, and more preferably 1 nm or greater. Although there is no upper limit to the thickness of the plating adhesion layer 109, the upper limit of the thickness is preferably 2 μm or less from the point of view of productivity.

The production method for the plating adhesion layer 109 is not limited, and examples thereof include a conventional sputtering method and deposition method. Since sputtered particles having high energy hit the surface of a base to form a film in the sputtering method, it is possible to form a film having high adhesion. Therefore, a sputtering method is preferably used to form the plating adhesion layer 109.

The plated metal plate 110 is formed by an electroless plating method or electrolysis plating method. When an electroless plating method is used, it is preferable to plate a NiP alloy. In contrast, when an electrolysis plating method is used, it is preferable to plate Cu. In order to maintain sufficient strength as a plate, the thickness of the plated metal plate 110 is preferably 10 μm or greater. However, if the plated metal plate 110 is too thick, the plated metal plate 110 easily peels and productivity decreases; therefore, the thickness is preferably 200 μm or less.

Before plating, it is preferable to degrease and wash the surface of the nitride semiconductor device using widely used neutral detergents. In addition, it is also preferable to chemically etch the surface of the plating adhesion layer using acids such as nitric acid to remove a natural oxide film on the plating adhesion layer.

When the plated metal plate 110 is made by NiP plating, the plated metal plate 110 is preferably formed by electroless plating using a plating bath comprising a source of nickel such as nickel sulfate and nickel chloride, and a phosphorous source such as hypophosphite. Examples of a suitable commercialized product of a plating bath used in electroless plating include NIMUDEN® HDX marketed by Uemura & Co., Ltd. The pH of the plating bath during electroless plating is preferably in a range from 4 to 10, and the temperature thereof is preferably in a range from 30 to 95° C.

When the plated metal plate 110 is made by plating Cu or a Cu alloy, the plated metal plate 110 is preferably formed by electrolysis plating using a plating bath comprising a source of Cu such as copper sulfate. The plating bath during electrolysis plating is preferably strongly acidic, that is, the pH thereof is preferably 2 or less. The temperature thereof is preferably in a range from 10 to 50° C. and more preferably room temperature (25° C.). The current density is preferably in a range from 0.5 to 10 A/dm$^2$, and more preferably in a range from 2 to 4 A/dm$^2$.

In addition, in order to make the surface smooth, a leveling agent is preferably added to the plating bath. Examples of a commercialized product of a leveling agent used include ETN-1-A and ETN-1-B, marketed by Uemura & Co., Ltd.

In order to improve adhesion of the plating metal layer 110, it is preferable to anneal the plated metal plate 110. The annealing temperature is preferably in a range from 100 to 300° C. to improve adhesion. If the annealing temperature is more than the above range adhesion may be further improved, but ohmic properties may be degraded.

As a method of forming the ohmic contact layer 107, reflection layer 108 (a metal film layer), and plated metal plate 110 partially on the p-type semiconductor layer 105 (transparent electrode 106), several methods are considered.

As a method of forming the ohmic contact layer 107, reflection layer 108 partially, well-known photo lithographic technique and lift-off technique can be used.

As a method of forming the plated metal plate 110 partially, the two following methods are mainly considered.

(1) An insulating protection film is formed on the part other than the ohmic contact layer 107 and reflection layer 108. As a result, plating is formed only on the patterned ohmic contact layer 107 and reflection layer 108 because plating cannot be formed on an insulating film.

(2) A thick film resist material for plating is used in a well-known photolithography technique and lift-off technique.

As a pattern of the ohmic contact layer 107, reflection layer 108, pattern shape of the plated metal plate 110, it is necessary to keep the balance of two inconsistent characteristics, one of which is decreasing the area of each of the layers of the p-type semiconductor layer 105 as much as possible, and the other of which is holding the strength of the plated metal plate 110 as a substrate as much as possible.

It is preferable that the formed pattern of the ohmic contact layer 107, reflection layer 108, and plated metal plate 110 are a cross as shown in FIG. 5 to FIG. 7 in a view of holding strength of the substrate while decreasing the occupied area of the p-type semiconductor layer 105 as much as possible.

However, as a pattern of the ohmic contact layer 107, reflection layer 108, plated metal plate 110, it is not limited to a pattern shown in FIG. 7 or FIG. 8. It is preferable that a pattern on the transparent electrode 106 be a shape of grid, mesh, crossline, comb, round ring, square ring, Y or L, which can be decided appropriately according to strength of the substrate and installation characteristics of metal pads to be described below.

It is also preferable to form a wide area which metal pads are attached to, in order to make it easy to set a bonding wire. For example, as shown in FIG. 9, it is preferable to form a rough circle pattern from the top view having the bulge 311 in the cross part 320 of the plated metal plate 310 at the center of the device unit in order to set a bonding wire.

As the light-permeable material, it is preferable to use a light-permeable resin, a silica-based material, a titania-based material.

As a light-permeable resin, well-known materials having light-permeable characteristics, such as a polymethylmethacrylate-based resin, a polycarbonate-based resin, polyimide-based resin, an epoxy resin, and a silicone resin, can be used without limitation at all.

As an application method of a light-permeable resin, a well-known method, such as a spin-coating method, an injection molding method, can be used without limitation at all, however, it is preferable to use a spin-coating method from the viewpoint of productivity.

As a silica-based material, a well-known silica-based material having light-permeable characteristics, such as a silica sol, methyl siloxane-based material, high methyl siloxane-based material, hydrogenation methyl methyl siloxane-based material, phosphorus-doped silicate based material, a polysilazane-based material, can be used without limitation at all.

In addition, after application of a silica-based material, it is preferable to treat it in a humidification condition from the viewpoint that transformation to silica glass becomes easier in that condition.

After application of a silica-based material, it is preferred to perform a baking process at the temperature of 100 to 500° C. from the viewpoint of hardness improvement and that water or organic component which is contained in a silica-based material can be removed.

As an application method of a silica-based material, a well-known method, such as a spin-coating method, spray method, a dip-coating method, can be used without limitation at all, however, it is preferable to use a spin-coating method from the viewpoint of productivity.

As a titania-based material, a well-known material such as titania sol, a titania phosphate can be used without limitation at all.

After application of a titania-based material, it is preferred to perform a baking process at the temperature of 100 to 500° C. from the viewpoint of hardness improvement and that water or organic component which is contained in a silica-based material can be removed.

As an application method of titania-based material, a well-known method, such as a spin-coating method, spray method, a dip-coating method, can be used without limitation at all, however, it is preferable to use a spin-coating method from the viewpoint of productivity.

A reason to provide the light-permeable material layer 114 is because light-extracting efficiency of a nitride semiconductor light-emitting device can be improved by forming the light-permeable material layer 114 using a light-permeable material having a high refractive index on the p-type semiconductor 105 (transparent electrode 106). Thus, it is preferable to form the light-permeable material layer 114 on the p-type semiconductor layer 105 or on a p-type semiconductor layer through the intermediary of the transparent electrode 106.

It is preferable that a refractive index of the light-permeable material layer 114 be within the range of 1.4 to 2.6 from the viewpoint that light-extracting efficiency of a nitride semiconductor light-emitting device can be improved.

In addition, it is preferable that the light-permeable material layer 114 has a transmittance equal to or more than 80% within a wavelength range of 350 nm to 550 nm.

As shown in FIG. 8, the light-permeable material layer 214 is formed without a gap on the transparent electrode 206 in the region where the ohmic contact layer 207, reflection layer 208, plating adhesion layer 209 and plated metal plate 210 are not formed. As a result, the two effects of improvement of light-extracting efficiency by the light-permeable material layer 214 and improvement of substrate strength by the plated metal plate 210 can be achieved compatibly.

In addition, it is usually difficult to form a thick film using a silica-based material, or titania-based material as a light-permeable material, however, it become possible to form a thick film having a thickness equal or more than 5 µm by a constitution where the light-permeable material is in an adhesive bonding state with the ohmic contact layer 207, reflection layer 208, plating adhesion layer 209 and plated metal plate 210 on the transparent electrode 206.

It is necessary that the thickness of the light-permeable material be equal to or more than 1 µm in order to improve light-extracting efficiency. It is necessary that the thickness of the light-permeable material be equal to or less than 200 µm, which is the maximum of the most suitable film thickness range of the plated metal plate 210, in order to provide a constitution where the light-permeable material is in an adhesive bonding state with the ohmic contact layer 207, reflection layer 208, plating adhesion layer 209 and plated metal plate 210 on the transparent electrode 206.

After the formation of the plated metal plate 110, a sapphire substrate (sapphire substrate 201 in FIG. 6) is exfoliated. Examples of a method to exfoliate a sapphire substrate include any conventional methods such as a polishing method, etching method, a laser-lift-off method.

After a sapphire substrate is exfoliated, the buffer layer (buffer layer 202 in FIG. 6) is removed by a polishing method or etching method, or the like, and the n-type semiconductor layer 103 is exposed. A negative electrode, which is abbreviated for illustration in figures, is formed on the n-type semiconductor layer 103. As the negative electrode, conventional negative electrodes having various compositions and structures can be used without any limitation.

As the positive electrode formed, various positive electrodes comprising Au, Al, Ni, Cu, and the like are known. In the present invention, these conventional positive electrodes can be used without any limitation.

EXAMPLE

The present invention will be explained below with reference to Examples and Comparative Examples in detail, but the present invention is not limited to the following examples.

Example 1

In Example 1, a nitride semiconductor light-emitting device as shown in FIG. 1 which is a cross-sectional view, was produced.

Firstly, on a sapphire substrate, on the buffer layer 102 made of AlN having a thickness of 10 nm, a Si-doped n-type GaN contact layer having a thickness of 5 nm; an n-type $In_{0.1}Ga_{0.9}N$ cladding layer having a thickness of 30 nm; a light-emitting layer having a multi-well structure in which a Si-doped n-type GaN barrier layer having a thickness of 30 nm and an $In_{0.2}Ga_{0.8}N$ well layer having a thickness of 2.5 nm were stacked five times and then the barrier layer was stacked; a Mg-doped p-type $Al_{0.07}Ga_{0.93}N$ cladding layer having a thickness of 50 nm; and a Mg-doped p-type GaN contact layer having a thickness of 150 nm were stacked successively.

On the p-type semiconductor layer 105, a transparent electrode made of an ITO film ($SnO_2$: 10% by weight) having a thickness of 300 nm was deposited by an evaporation method, and was annealed for one hour at a temperature of 300° C. under an oxygen atmosphere.

After that, the ohmic contact layer 107 made of a Pt layer having a thickness of 1.5 nm and reflection layer 108 made of an Ag layer having a thickness of 30 nm was formed in the this order by sputtering. Then, the plating adhesion layer 109, which is a film made of NiP alloy (Ni: 80 at %, P: 20 at %) having a thickness of 30 nm was formed by sputtering. The ohmic contact layer 107 (Pt layer), the reflection layer 108 (the Ag layer) and the plating adhesion layer 109 were patterned to a cross shape by conventional photolithography and lift-off techniques.

When a pattern width W is 30 µm, the ratio of the area of a cross pattern (30×300+30×270=17,100 µm$^2$) to the area of a transparent electrode pattern (300×300=90,000 µm$^2$) is 17,100/90,000=19%.

Next, a film of a resist material made of $SiO_2$ having a thickness of 100 nm was formed on the transparent electrode 106 in a region where the metal film layer composed of the ohmic contact layer 107, reflection layer 108, plating adhesion layer 109 was not formed. The resist material was patterned by a well-known photo lithographic technique and lift-off technique.

The surface of the plating adhesion layer 109 was immersed in a nitric acid solution (5N) at 25° C. for 30 seconds to remove an oxide film formed on the surface of the plating adhesion layer 109.

Then, the plated metal plate 110 which is a film made of a NiP alloy having a thickness of 50 µm was formed on the plating adhesion layer 109 by an electroless plating method using a plating bath (NIUMUDEN® HDX-7G, marketed by Uemura & Co., Ltd.). The electroless plating was performed under conditions in which the pH was 4.6, the temperature was 90° C., and the treatment time was 3 hours. After the plated metal plate 110 was washed with water and dried, it was annealed at 250° C. for 1 hour using a clean oven.

After that, the substrate and the buffer layer were removed by a polishing method to expose the n-type semiconductor layer 103.

Then, an ITO film ($SnO_2$: 10% by weight) having a thickness of 400 nm was formed on the n-type semiconductor layer 103 by deposition. Then, a negative electrode comprising a Cr film having a thickness of 40 nm, a Ti film having a thickness of 100 nm, and a Au film having a thickness of 1,000 nm was formed on the center of the surface of the ITO by deposition. The pattern of the negative electrode was formed by conventional photolithography and lift-off techniques.

On the surface of the p-type semiconductor, a positive electrode, which is omitted in Figures, comprising a Au film having a thickness of 1,000 nm was formed by deposition.

Then, the nitride semiconductor light-emitting device shown in FIG. 1 having a 350 μm square was obtained by dicing.

The resulting nitride semiconductor light-emitting device was installed in a TO-18 package, and the output power for 20 mA of input current was measured using a tester. The output power of the light-emitting device in this example was 20 mW.

Comparative Example 1

A conventional nitride semiconductor light-emitting device was prepared in a manner identical to that of Example 1, except that a transparent electrode made from ITO was not formed, and an ohmic contact layer, reflection layer, plated metal plate were formed on the entire surface of a p-type semiconductor layer.

The formed nitride semiconductor light-emitting device was installed in a TO-18 package, and the output power for 20 mA of input current was measured using a tester. The output power of the light-emitting device in this example was 18 mW.

[An Evaluation Result]

An output power of 20 mW was obtained in the nitride semiconductor light-emitting device (Example 1) of the present invention in which the ohmic contact layer, reflection layer, plated metal plate were formed partially on the surface of the p-type semiconductor layer. In contrast, an output power of 18 mW was obtained in the conventional nitride semiconductor light-emitting device (Comparative example 1) of the present invention in which the ohmic contact layer, reflection layer, plated metal plate were formed entirely on the surface of the p-type semiconductor layer. A 10% difference of the output power was observed.

In the nitride semiconductor light-emitting device of the present invention shown in Example 1, an area of the reflection layer 108 is smaller than that of the p-type semiconductor layer 105. Therefore, the problem that output power decreases because of light absorption of the light-emitting layer 104 when the reflection light from the reflection layer 108 re-entered into the light-emitting layer 104, was solved, and output power from the rear surface of the device improved.

It is clear from the results that the nitride semiconductor light-emitting device of the present invention is superior in light-extracting efficiency.

Example 2

In this Example, a nitride semiconductor light-emitting device as shown in FIG. 5 which is a cross-sectional view, was produced.

Firstly, on a sapphire substrate, on a buffer layer made of AlN having a thickness of 10 nm, a Si-doped n-type GaN contact layer having a thickness of 5 nm; an n-type $In_{0.1}Ga_{0.9}N$ cladding layer having a thickness of 30 nm; a light-emitting layer having a multi-well structure in which a Si-doped n-type GaN barrier layer having a thickness of 30 nm and an $In_{0.2}G_{0.8}N$ well layer having a thickness of 2.5 nm were stacked five times and then the barrier layer was stacked; a Mg-doped p-type $Al_{0.07}Ga0_{.93}N$ cladding layer having a thickness of 50 nm; and a Mg-doped p-type GaN contact layer having a thickness of 150 nm were stacked successively.

On the p-type semiconductor layer 105, a transparent electrode made of an ITO film ($SnO_2$: 10% by weight) having a thickness of 300 nm was deposited by an evaporation method, and was annealed for one hour at a temperature of 300° C. under an oxygen atmosphere.

After that, the ohmic contact layer 107 made of a Pt layer having a thickness of 1.5 nm was formed by sputtering, and the reflection layer 108 made of an Ag layer having a thickness of 30 nm, was formed by sputtering on the ohmic contact layer 107. Then, the plating adhesion layer 109, which is a film made of NiP alloy (Ni: 80 at %, P: 20 at %) having a thickness of 30 nm was formed by sputtering. The ohmic contact layer 107 (Pt layer), the reflection layer 108 (an Ag layer) and the plating adhesion layer 109 were patterned to a cross shape by conventional photolithography and lift-off techniques, as shown in FIG. 7.

When a pattern width W is 30 μm, the ratio of the area of a cross pattern ($30 \times 300 + 30 \times 270 = 17,100$ μm$^2$) to the area of a transparent electrode pattern ($300 \times 300 = 90,000$ μm$^2$) is 17,100/90,000=19%.

Next, a film of a thick resist material (Made in AZ Electronic Materials Co., AZ UT21-HR) made of $SiO_2$ having a thickness of 10 nm was formed on the transparent electrode 106 in a region where the metal film layer composed of the ohmic contact layer 107, reflection layer 108, plating adhesion layer 109 was not formed. The resist material was patterned by a well-known photo lithographic technique and lift-off technique.

The surface of the plating adhesion layer 109 was immersed in a nitric acid solution (5N) at 25° C. for 30 seconds to remove an oxide film formed on the surface of the plating adhesion layer 109.

Then, the plated metal plate 110 which is a film made of a NiP alloy having a thickness of 50 μm was formed on the plating adhesion layer 109 by an electroless plating method using a plating bath (NIUMUDEN® HDX-7G, marketed by Uemura & Co., Ltd.). The electroless plating was performed under conditions in which the pH was 4.6, the temperature was 90° C., and the treatment time was 3 hours. After the plated metal plate 110 was washed with water and dried, it was annealed at 250% for 1 hour using a clean oven.

Next, the light-permeable material layer 114 was formed by applying a liquid light-permeable resin (Made by Shinetsu Chemical Company, silicone resin SCR-1011, refractive index is 1.5.) without a gap on the transparent electrode 106 in a region where a metal film layer composed of the ohmic contact layer 107, reflection layer 108, plating adhesion layer 109 are not formed, and then drying and curing the resin at 100° C. for one hour and 150° C. for five hours.

After that, the substrate and the buffer layer were removed by a polishing method to expose the n-type semiconductor layer 103.

Then, an ITO film (SnO2: 10% by weight) having a thickness of 400 nm was formed on the n-type semiconductor layer 103 by deposition. Then, a negative electrode comprising a Cr film having a thickness of 40 nm, a Ti film having a thickness of 100 nm, and a Au film having a thickness of 1,000 nm was formed on the center of the surface of the ITO by deposition. The pattern of the negative electrode was formed by conventional photolithography and lift-off techniques.

On the surface of the p type semiconductor, a positive electrode, which is omitted in Figures, comprising a Au film having a thickness of 1,000 nm was formed by deposition.

Then, the nitride semiconductor light-emitting devices 2 shown in FIG. 1 having a 350 µm square was obtained by dicing.

The resulting nitride semiconductor light-emitting device was installed in a TO-18 package, and the output power for 20 mA of input current was measured using a tester. The output power of the light-emitting device in this example was 21 mW.

Example 3

A nitride semiconductor light-emitting device of the present invention was prepared in a manner identical to that of Example 2, except that titania sol was used as the light-permeable material layer 114 instead of silicone resin.

The titania sol was dried and solidified by treatment at 150° C. for 1 hour and 300° C. for 3 hours after application. The refractive index of the titania sol was 2.2.

The formed nitride semiconductor light-emitting device was installed in a TO-18 package, and the output power for 20 mA of input current was measured using a tester. The output power of the light-emitting device in this example was 22 mW.

Comparative Example 2

A nitride semiconductor light-emitting device of the present invention was prepared in a manner identical to that of Example 2, except that that the light-permeable material layer was not formed.

The formed nitride semiconductor light-emitting device was installed in a TO-18 package, and the output power for 20 mA of input current was measured using a tester. The output power of the light-emitting device in this example was 20 mW.

[An Evaluation Result]

An output power of 21 mW was obtained in the nitride semiconductor light-emitting device (Example 2) of the present invention in which the ohmic contact layer, reflection layer, plated metal plate were formed partially on the surface of the p-type semiconductor layer, and the light-permeable material layer made of silicone resin was formed in a region where the above-mentioned layer was not formed.

In addition, an output power of 22 mW was obtained in the nitride semiconductor light-emitting device of Example 3 in which titania sol resin was used as a light-permeable material layer instead of silicone resin.

In contrast, an output power of 20 mW was obtained in the nitride semiconductor light-emitting device of Comparative example 2 in which a light-permeable material layer was not formed.

It is confirmed that the output power of the nitride semiconductor light-emitting device of Example 2 in which a silicone resin having a refractive index of 1.5 was used as a material of a light-permeable material layer, is improved by 5% in comparison with that of the nitride semiconductor light-emitting device of Comparative Example 2 in which no light-permeable material layer was formed.

It is also confirmed that the output power of the nitride semiconductor light-emitting device of Example 3 in which a titania sol resin having a refractive index of 2.2 was used as a material of a light-permeable material layer, is improved by 10% in comparison with that of the nitride semiconductor light-emitting device of Comparative Example 2.

It is clear that light-extracting efficiency is improved with the increase of the refractive index of a light-permeable material layer because a refractive index is 1 when no light-permeable material layer is formed. This is because the total internal reflection becomes harder to occur by increasing a critical angle when a material having a high refractive within a range from 1.4 to 2.6 is used as a light-permeable material. And, the reason the upper limit is 2.6 is because that it is not necessary to use a material with a refractive index more than that of GaN, which has a refractive index of 2.6. When it is more than the limit, it becomes difficult to extract light from a light-permeable material.

It is clear from the results that the nitride semiconductor light-emitting device of the present invention is superior in light-extracting efficiency.

INDUSTRIAL APPLICABILITY

The nitride semiconductor light-emitting device provided by the present invention has superior characteristics and stability, and is useful as a material of a light-emitting diode and a lamp.

The invention claimed is:

1. A nitride semiconductor light-emitting device, comprising:
   an n-type semiconductor layer,
   a light-emitting layer,
   a p-type semiconductor layer,
   a metal film layer, and
   a plated metal plate,
   which are stacked on a substrate,
   wherein the metal film layer and the plated metal plate are formed partially on the p-type semiconductor layer, and
   the metal film layer and the plated metal plate are formed in a cross shape from the top view on the p-type semiconductor layer.

2. A nitride semiconductor light-emitting device according to claim 1, wherein the ratio of an area of the metal film layer and the plated metal plate formed on the p-type semiconductor layer to an area of a top surface of the p-type semiconductor is in a range of 10 to 90%.

3. A nitride semiconductor light-emitting device according to claim 1, wherein the device is formed by dicing.

4. A nitride semiconductor light-emitting device according to claim 1, further comprising a transparent electrode on the p-type semiconductor layer.

5. A nitride semiconductor light-emitting device according to claim 1, further comprising an ohmic contact layer.

6. A nitride semiconductor light-emitting device according to claim 5, wherein the ohmic contact layer is composed of a simple substance metal and/or an alloy of Pt, Ru, Os, Rh, Ir, Pd, Ag.

7. A nitride semiconductor light-emitting device according to claim 5, wherein the ohmic contact layer has a thickness in a range of 0.1 nm to 30 nm.

8. A nitride semiconductor light-emitting device according to claim 1, wherein the plated metal plate has a thickness in a range of 10 µm to 200 µm.

9. A nitride semiconductor light-emitting device according to claim 1, wherein the plated metal plate is composed of a NiP alloy, Cu or an alloy of Cu.

10. A nitride semiconductor light-emitting device according to claim 1, further comprising a plating adhesion layer formed between the metal film layer and the plated metal plate.

11. A nitride semiconductor light-emitting device according to claim 10, wherein the plating adhesion layer comprises a component at 50% by weight or more, which is the same as the main plating component which is contained at 50% by weight or more in the plated metal layer.

12. A nitride semiconductor light-emitting device according to claim 10, wherein the plating adhesion layer is composed of a NiP alloy or a Cu alloy.

13. A nitride semiconductor light-emitting device according to claim 1, further comprising a light-permeable material layer formed on the p-type semiconductor layer in a region where the metal film layer and the plated metal plate are not formed.

14. A nitride semiconductor light-emitting device according to claim 13, wherein the light-permeable material layer is formed on the p-type semiconductor layer, and the light-permeable material layer is surrounded at least partially by the metal film layer and the plated metal plate.

15. A nitride semiconductor light-emitting device according to claim 13, wherein the light-permeable material layer is formed on the p-type semiconductor layer through an intermediary of a transparent electrode, and the light-permeable material layer is surrounded at least partially by the metal film layer and the plated metal plate.

16. A nitride semiconductor light-emitting device according to claim 13, wherein the light-permeable material layer is made from a light-permeable resin, a silica-based material or a titania-based material.

17. A nitride semiconductor light-emitting device according to claim 13, wherein a refractive index of the light-permeable material layer is in a range of 1.4 to 2.6.

18. A nitride semiconductor light-emitting device according to claim 13, wherein a thickness of the light-permeable material layer is in a range of 10 to 200 μm.

19. A nitride semiconductor light-emitting device according to claim 13, further comprising an ohmic contact layer.

20. A nitride semiconductor light-emitting device according to claim 19, wherein the ohmic contact layer is composed of a simple substance metal and/or an alloy of Pt, Ru, Os, Rh, Ir, Pd, Ag.

21. A nitride semiconductor light-emitting device according to claim 19, wherein the ohmic contact layer has a thickness in a range of 0.1 nm to 30 nm.

22. A nitride semiconductor light-emitting device as claimed in claim 13, wherein the plated metal plate has a thickness in a range of 10 μm to 200 μm.

23. A nitride semiconductor light-emitting device according to claim 13, wherein the plated metal plate is composed of a NiP alloy, Cu or an alloy of Cu.

24. A nitride semiconductor light-emitting device according to claim 13, further comprising a plating adhesion layer formed between the metal film layer and the plated metal plate.

25. A nitride semiconductor light-emitting device according to claim 24, wherein the plating adhesion layer comprises a component at 50% by weight or more, which is the same as the main plating component which is contained at 50% by weight or more in the plated metal plate.

26. A nitride semiconductor light-emitting device according to claim 24, wherein the plating adhesion layer is composed of a NiP alloy or a Cu alloy.

27. A method of producing a nitride semiconductor light-emitting device, said device comprising:
an n-type semiconductor layer,
a light-emitting layer,
a p-type semiconductor layer,
a metal film layer, and
a plated metal plate,
which are stacked on a substrate,
said method comprising:
forming stacked layers by stacking at least an n-type semiconductor layer, a light-emitting layer, a p-type semiconductor layer, a metal film layer, a plated metal plate on a substrate,
wherein the metal film layer and the plated metal plate are formed partially on the p-type semiconductor layer, and
the metal film layer and the plated metal plate are formed in a cross shape from the top view on the p-type semiconductor layer.

28. The method of producing a nitride semiconductor light-emitting device according to claim 27,
wherein the n-type semiconductor layer is formed on a substrate through the intermediary of a buffer layer, and when the process of forming stacked layers is performed, the n-type semiconductor layer is exposed by removing the substrate and the buffer layer.

29. The method of producing a nitride semiconductor light-emitting device according to claim 28, wherein the substrate is removed by using a laser.

30. The method of producing a nitride semiconductor light-emitting device according to claim 27, further comprising a heat-treating process in a temperature range from 100° C. to 300° C. after forming the plated metal plate.

31. The method of producing a nitride semiconductor light-emitting device according to claim 27, further comprising:
forming a light-permeable material layer on the p-type semiconductor layer in a region where the metal film layer and the plated metal plate are not formed.

32. The method of producing a nitride semiconductor light-emitting device according to claim 31, wherein the n-type semiconductor layer is formed on a substrate through the intermediary of a buffer layer, and when the process of forming stacked layers is performed, the n-type semiconductor layer is exposed by removing the substrate and the buffer layer.

33. The method of producing a nitride semiconductor light-emitting device according to claim 32, wherein the substrate is removed by using a laser.

34. The method of producing a nitride semiconductor light-emitting device according to claim 31, further comprising a heat-treating process in a temperature range from 100° C. to 300° C. after forming the plated metal plate.

* * * * *